United States Patent
Lee et al.

(10) Patent No.: US 9,768,193 B2
(45) Date of Patent: Sep. 19, 2017

(54) THREE-DIMENSIONAL (3D) SEMICONDUCTOR DEVICES AND METHODS OF FABRICATING 3D SEMICONDUCTOR DEVICES

(71) Applicant: SAMSUNG ELECTRONICS CO., LTD., Suwon-si, Gyeonggi-Do (KR)

(72) Inventors: Jaegoo Lee, Suwon-si (KR); Youngwoo Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/141,263

(22) Filed: Apr. 28, 2016

(65) Prior Publication Data

US 2016/0240555 A1     Aug. 18, 2016

Related U.S. Application Data

(62) Division of application No. 14/637,755, filed on Mar. 4, 2015, now Pat. No. 9,362,226.

(30) Foreign Application Priority Data

Mar. 7, 2014 (KR) ........................ 10-2014-0027243

(51) Int. Cl.
| | |
|---|---|
| H01L 21/8238 | (2006.01) |
| H01L 21/336 | (2006.01) |
| H01L 29/76 | (2006.01) |
| H01L 29/06 | (2006.01) |
| H01L 27/11582 | (2017.01) |
| H01L 23/522 | (2006.01) |
| H01L 23/528 | (2006.01) |
| H01L 27/11556 | (2017.01) |
| H01L 27/11548 | (2017.01) |
| H01L 27/11575 | (2017.01) |

(52) U.S. Cl.
CPC ...... *H01L 27/11582* (2013.01); *H01L 23/528* (2013.01); *H01L 23/5226* (2013.01); *H01L 27/11548* (2013.01); *H01L 27/11556* (2013.01); *H01L 27/11575* (2013.01); *H01L 2924/0002* (2013.01)

(58) Field of Classification Search
CPC ........... H01L 27/0688; H01L 27/11578; H01L 27/11551; H01L 27/2481; H01L 27/2454; H01L 2224/32145; H01L 29/7889; H01L 29/7926; H01L 25/0657
USPC ........ 438/212, 268, 269, 275; 257/324, 328, 257/618, 621, 622, 686, 786
See application file for complete search history.

(56) References Cited

U.S. PATENT DOCUMENTS

| | | |
|---|---|---|
| 7,875,922 B2 | 1/2011 | Arai et al. |
| 8,304,348 B2 | 11/2012 | Hashimoto |
| | (Continued) | |

*Primary Examiner* — Hsien Ming Lee
(74) *Attorney, Agent, or Firm* — Volentine & Whitt, PLLC

(57) ABSTRACT

A three-dimensional (3D) semiconductor device includes a stack of conductive layers spaced from each other in a vertical direction, the stack having a staircase-shaped section in a connection region, and ends of the conductive layers constituting treads of the staircase-shaped section, respectively. The 3D semiconductor device further includes buffer patterns disposed on and protruding above the respective ends of the conductive layers, an interconnection structure disposed above the stack and including conductive lines, and contact plugs extending vertically between the conductive lines and the buffer patterns and electrically connected to the conductive layers of the stack via the buffer patterns.

19 Claims, 31 Drawing Sheets

(56) References Cited

U.S. PATENT DOCUMENTS

| | | |
|---|---|---|
| 8,314,455 B2 | 11/2012 | Shiino et al. |
| 8,324,680 B2 | 12/2012 | Izumi et al. |
| 8,378,409 B2 | 2/2013 | Park |
| 8,461,566 B2 | 6/2013 | Tang et al. |
| 8,659,944 B2 | 2/2014 | Hung et al. |
| 2012/0108048 A1 | 5/2012 | Lim et al. |
| 2012/0146122 A1 | 6/2012 | Whang et al. |
| 2012/0168858 A1 | 7/2012 | Hong |
| 2013/0043509 A1 | 2/2013 | Cho et al. |
| 2013/0130468 A1 | 5/2013 | Higashitani et al. |

THREE-DIMENSIONAL (3D) SEMICONDUCTOR DEVICES AND METHODS OF FABRICATING 3D SEMICONDUCTOR DEVICES

PRIORITY STATEMENT

This is a Divisional of U.S. application Ser. No. 14/637,755, filed Mar. 4, 2015, in which a claim of priority under 35 U.S.C. §119 is made to Korean Patent Application No. 10-2014-0027243, filed on Mar. 7, 2014, in the Korean Intellectual Property Office, the entire contents of which are hereby incorporated by reference.

BACKGROUND

The inventive concept relates to semiconductor devices and to methods of fabricating semiconductor devices. In particular, the inventive concept relates to three-dimensional (3D) semiconductor devices and to methods of fabricating 3D semiconductor devices.

More highly integrated semiconductor devices are required to satisfy consumer demands for electronic products that offer superior performance and yet which are relatively inexpensive. This is especially true of semiconductor memory devices. In the case of a typical two-dimensional or planar semiconductor memory device, the integration (density) of the device mainly corresponds to the area occupied by a unit memory cell of the device. Accordingly, the degree to which a two-dimensional or planar semiconductor memory device can be integrated greatly depends on the level of fineness of patterns that can be formed by patterning techniques in the device manufacturing process. However, cost savings that may be realized when increasing the degree of integration of two-dimensional or planar semiconductor devices are offset by the prohibitive expense associated with processing equipment needed to form extremely fine patterns. To overcome such a drawback, three-dimensional semiconductor memory devices having three-dimensionally arranged memory cells have been recently proposed.

SUMMARY

According to an aspect of the inventive concept, a three-dimensional (3D) semiconductor device is provided which includes a stack of conductive layers spaced from each other in a vertical direction, the stack having a staircase-shaped section in a connection region, and ends of the conductive layers constituting treads of the staircase-shaped section, respectively. The 3D semiconductor device further includes buffer patterns disposed on and protruding above the respective ends of the conductive layers, an interconnection structure disposed above the stack and including conductive lines, and contact plugs extending vertically between the conductive lines and the buffer patterns and electrically connected to the conductive layers of the stack via the buffer patterns.

The 3D semiconductor device may further include insulating layers interposed between the conductive layers of the stack, and at least one of the buffer patterns may protrude above an upper surface of an insulating layer located over a respective conductive layer on which the at least one buffer pattern is disposed.

Each buffer pattern may include a lower buffer pattern located on the end of a respective conductive layer, and an upper buffer pattern located on the lower buffer pattern, and the upper buffer pattern may penetrate the lower buffer pattern to contact the respective conductive layer, and the upper buffer pattern may extend at a depth into the respective conductive layer.

Each buffer pattern may further include an insulating sidewall located over a first surface portion of the lower buffer pattern along a riser of the staircase-shaped section adjacent the end of the respective conductive layer, and the upper buffer pattern may be located on a second surface portion of the lower buffer pattern adjacent the insulating sidewall.

A thickness of each of the lower buffer patterns may be between 0.1 times and 0.8 times both inclusive a thickness of each of the insulating layers.

At least a portion of the buffer patterns may extend upright over the respective ends of the conductive lines in the shape of a cylinder or a parallelepiped.

According to another aspect of the inventive concept, a 3D semiconductor device is provided which includes a stack of conductive layers spaced from each other in a vertical direction, the stack having a staircase-shaped section in a connection region, and ends of the conductive layers constituting treads of the staircase-shaped section, respectively. The 3D semiconductor device further includes contact holes extending upward over respective ends of the conductive layers, buffer patterns located within the respective contact holes, an interconnection structure disposed above the stack and including conductive lines, and contact plugs extending vertically between the conductive lines and the buffer patterns and electrically connected to the conductive layers of the stack via the buffer patterns.

The buffer patterns may be upper buffer patterns, and the 3D semiconductor device may further include lower buffer patterns located on the respective ends of the conductive layers. The contact holes may extend through the respective lower buffer patterns, and the upper buffer patterns may penetrate the respective lower buffers within the contact holes to contact the respective ends of the conductive layers. The contact holes may further extend to a depth within the respective conductive layers, and the upper buffer patterns may penetrate the depth of the respective conductive layers within the contact holes.

The contact holes may be cylindrical, and an aspect ratio of the contact holes may be between 0.7 and 1.3 both inclusive.

According to still another aspect of the inventive concept, a 3D semiconductor device is provided which includes a stack of conductive layers spaced from each other in a vertical direction, wherein the stack has a staircase-shaped section in a connection region of the device, and ends of the conductive layers constitute treads of the staircase-shaped section, respectively. The 3D semiconductor device further includes buffer patterns of an epitaxial material disposed on the respective ends of the conductive layers, an interconnection structure disposed above the stack and including conductive lines, and contact plugs extending vertically between the conductive lines and the buffer patterns and electrically connected to the conductive layers of the stack via the buffer patterns.

The epitaxial material may be doped with impurities.

The 3D semiconductor device may further include insulating layers interposed between the conductive layers of the stack. Also, each buffer pattern may include a lower buffer pattern of epitaxial material located on the end of a respective conductive layer, and an upper buffer pattern of epitaxial material located on the lower buffer pattern. A thickness of each lower buffer pattern may be less than a thickness of each insulating layer.

According to yet another aspect of the inventive concept, a 3D semiconductor device is provided which includes a stack of conductive layers spaced from each other in a vertical direction, the stack having a staircase-shaped section in a connection region, and ends of the conductive layers constituting treads of the staircase-shaped section, respectively. The 3D semiconductor device further includes buffer patterns disposed on respective ends of the conductive layers, an interconnection structure disposed above the stack and including conductive lines, and contact plugs extending vertically between the conductive lines and the buffer patterns and electrically connected to the conductive layers of the stack via the buffer patterns. A height of a first buffer pattern among the buffer patterns extends from a bottom surface of the first buffer pattern to a bottom surface of a contact plug connected to the first buffer pattern, and a height of a second buffer pattern among the buffer patterns extends from a bottom surface of the second buffer pattern to a bottom surface of a contact plug connected to the second buffer pattern, wherein the height of the first buffer pattern is less than the height of the second buffer pattern, and the first buffer pattern is located up the staircase-shape section relative to the second buffer pattern.

Respective heights of the buffer patterns may increase in succession in a downward direction for a least one segment of the staircase-shaped section. The staircase-shaped section may include plural segments, wherein respective heights of adjacent buffer patterns of adjacent segments decreases in a downward direction of the staircase-shaped section, and wherein respective heights of the buffer patterns increase in succession in a downward direction within each segment of the staircase-shaped section.

The 3D semiconductor memory device may further include insulating layers interposed between the conductive layers of the stack. Also, each buffer pattern may include a lower buffer pattern located on the end of a respective conductive layer, and an upper buffer pattern located on the lower buffer pattern. A thickness of each lower buffer pattern may be less than a thickness of each insulating layer.

At least a portion of buffer patterns may extend upright over the respective ends of the conductive lines in the shape of a cylinder or a parallelepiped.

The buffer patterns may be impurity doped epitaxial layers.

According to another aspect of the inventive concept, a method of fabricating a 3D semiconductor device is provided which includes alternately forming first and second layers on a substrate to produce a stack in which the second layers are spaced vertically from one another, patterning the stack to expose ends of each of the second layers in a connection region, wherein the patterning produces a staircase-shaped section of the stack in the connection region in which respective ends of the second layers constitute treads of the staircase-shape section, forming buffer patterns on and protruding above the respective ends of the second layers, forming contact plugs on the respective buffer patterns, and forming an interconnection structure on the stack, wherein the interconnection structure includes conductive lines electrically connected to the contact plugs.

The first layers may be insulating layers and the second layers may include silicon.

The forming of the buffer patterns may include covering the ends of the second layers with lower buffer patterns, respectively, and the lower buffer patterns may be formed epitaxially.

The forming of the buffer patterns may include forming a first upper insulating layer conformally on the stack including on the staircase-shaped section thereof, forming openings in the first upper insulating layer in alignment with the ends of the second layers, respectively, and forming upright buffer patterns in the openings, respectively. The upright buffer patterns may be formed epitaxially.

The forming of the buffer patterns may include forming spacer patterns on riser portions of the staircase-shaped structure, respectively, and subsequently forming upright buffer patterns on the ends of the second layers while the spacer patterns are disposed on the riser portions. The upright buffer patterns may be formed epitaxially.

The forming of the buffer patterns may include covering the ends of the conductive lines with lower buffer patterns, respectively, and subsequently forming upright buffer patterns on the ends of the conductive lines and each of which projects above the lower buffer pattern formed on the same end of the conductive line. The forming of the upright buffer patterns may include forming a first upper insulating layer conformally on the stack including on the staircase-shaped section thereof and on the lower buffer patterns, forming cell buffer openings in the first upper insulating layer in alignment with the ends of the conductive layers, respectively, and forming the upright buffer patterns in the cell buffer openings, respectively.

The forming of the buffer patterns may include forming spacer patterns on riser portions of the staircase-shaped structure, respectively, after the lower buffer patterns have been formed, and subsequently forming upright buffer patterns on the ends of the conductive lines, respectively, while the spacer patterns are disposed on the riser portions of the staircase-shaped section.

The method may further include a replacement process in which all or part of the second layer is replaced with a conductive layer, and the replacement process may be carried out before forming the contact plugs.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION OF THE PREFERRED EMBODIMENTS

Figure 1:
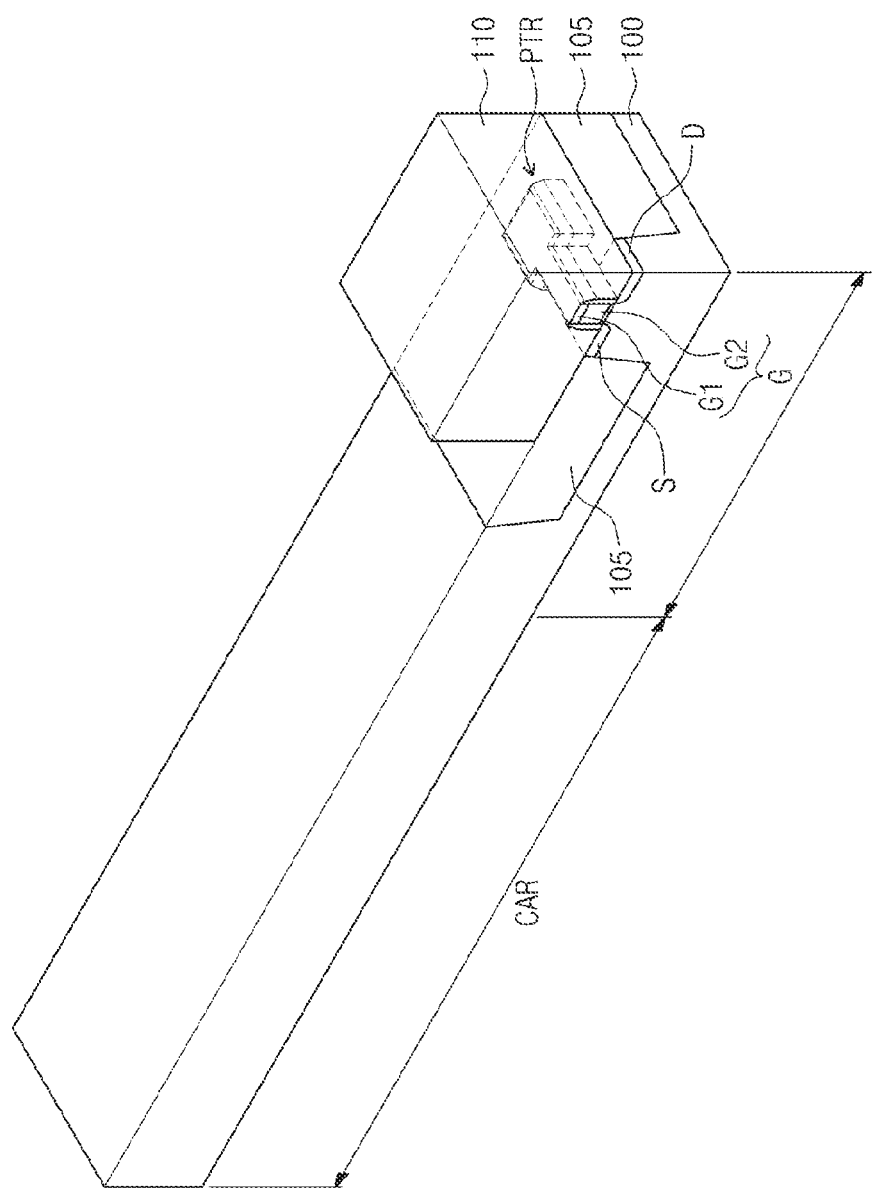
FIGS. 1, 2, 3, 4, 5, 6, 7, 8 and 9 are each a perspective view of a three-dimensional semiconductor device during the course of its manufacture and together illustrate one embodiment of a method of fabricating a three-dimensional semiconductor device, according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present. Furthermore, the term "connected" may refer to an electrical connection even when not expressly stated, as the context and drawings will make clear.

It will also be understood that although the terms first, second, third etc. are used herein to describe various elements, layers, etc., these elements and/or layers are not limited by these terms. These terms are only used to distinguish one element or layer or from another.

Furthermore, spatially relative terms, such as "upper," and "lower" are used to describe an element's and/or feature's relationship to another element(s) and/or feature(s) as illustrated in the figures. Also, the term "thickness" as used to describe an element, layer, or region will generally correspond to the dimension of that element, layer or region as measured in the vertical direction in the orientation shown in the drawings. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

A method of fabricating a three-dimensional semiconductor device, according to the inventive concept, will now be described in detail with reference to FIGS. 1 through 9.

Referring first to FIG. 1, a device isolation layer 105 is formed in a substrate 100 at a peripheral circuit region PERI of the device to define an active region. A peripheral transistor PTR is formed at the peripheral circuit region PERI. The peripheral transistor PTR may include a gate electrode G crossing the active region and source and drain electrodes S and D formed in the active region at both sides of the gate electrode G. The gate electrode G may include a first gate pattern G1 and a second gate pattern G2 sequentially stacked on the active region.

Subsequently, a lower insulating pattern 110 is formed to cover the peripheral transistor PTR. At this time, the lower insulating pattern 110 exposes that portion of the substrate 100 located in a cell array region CAR of the device.

Figure 2:
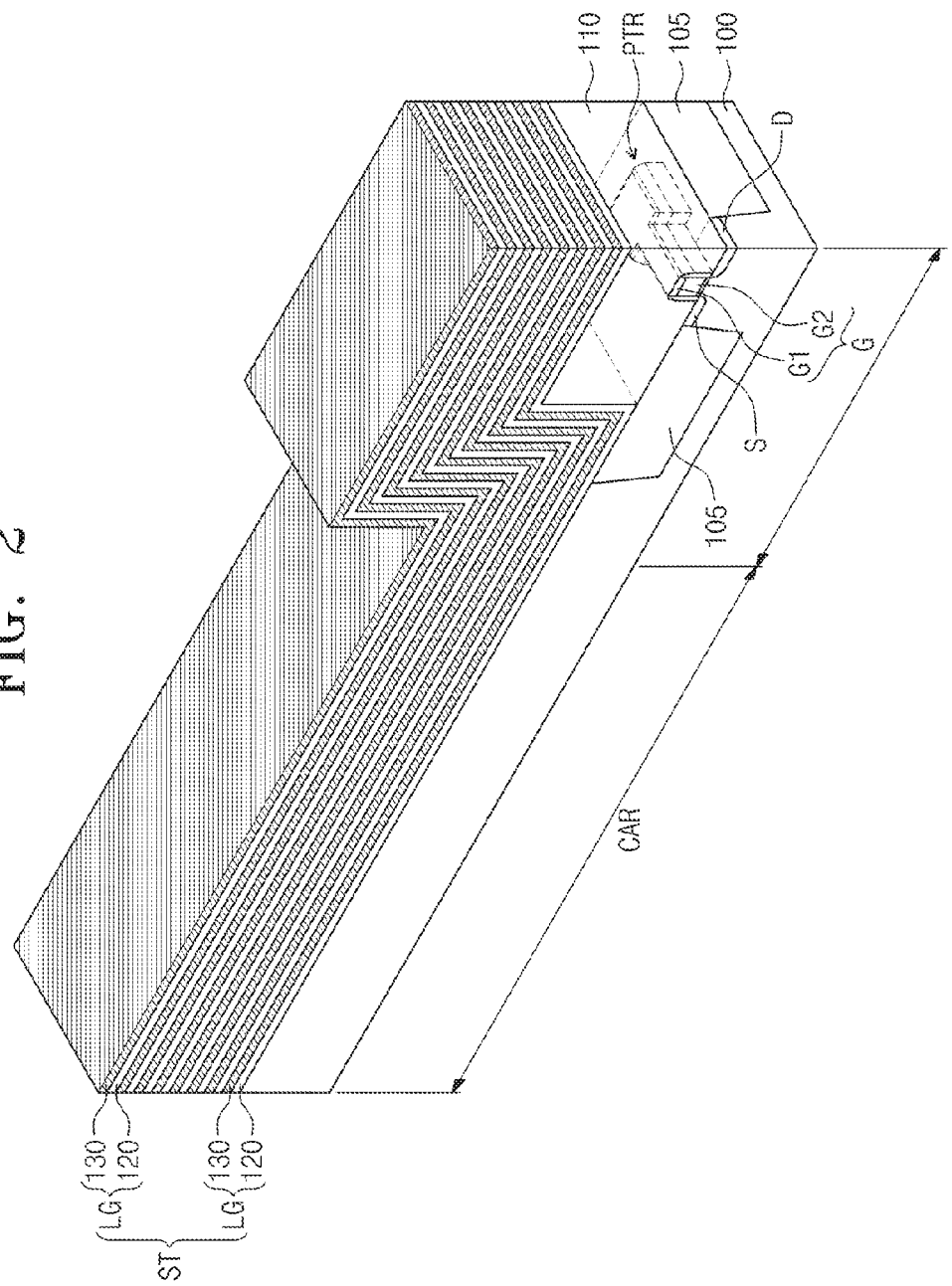

Referring to FIG. 2, a stack ST is formed on the resulting structure. The stack ST may include interlayer insulating layers 120 and silicon layers 130 stacked in an alternate manner. In an example of this embodiment, the interlayer insulating layers 120 are formed of a silicon oxide.

The stack ST has first and second portions in the cell array region CAR and the peripheral circuit region PERI, respectively, and a third portion extending along a sidewall surface of the lower insulating pattern 110 and connecting the first and second portions to each other. Due to the presence of the lower insulating pattern 110, the first portion located at the cell array region CAR has a top surface lower than that of the second portion located at the peripheral circuit region PERI.

The stack ST is constituted by a plurality of layer groups LG, each of which is composed of one of the interlayer insulating layers 120 and one of the silicon layers 130 disposed thereon. For convenience, the thickness of each of the layer groups LG will be referred to as a 'unit group thickness UGT'.

Figure 3:
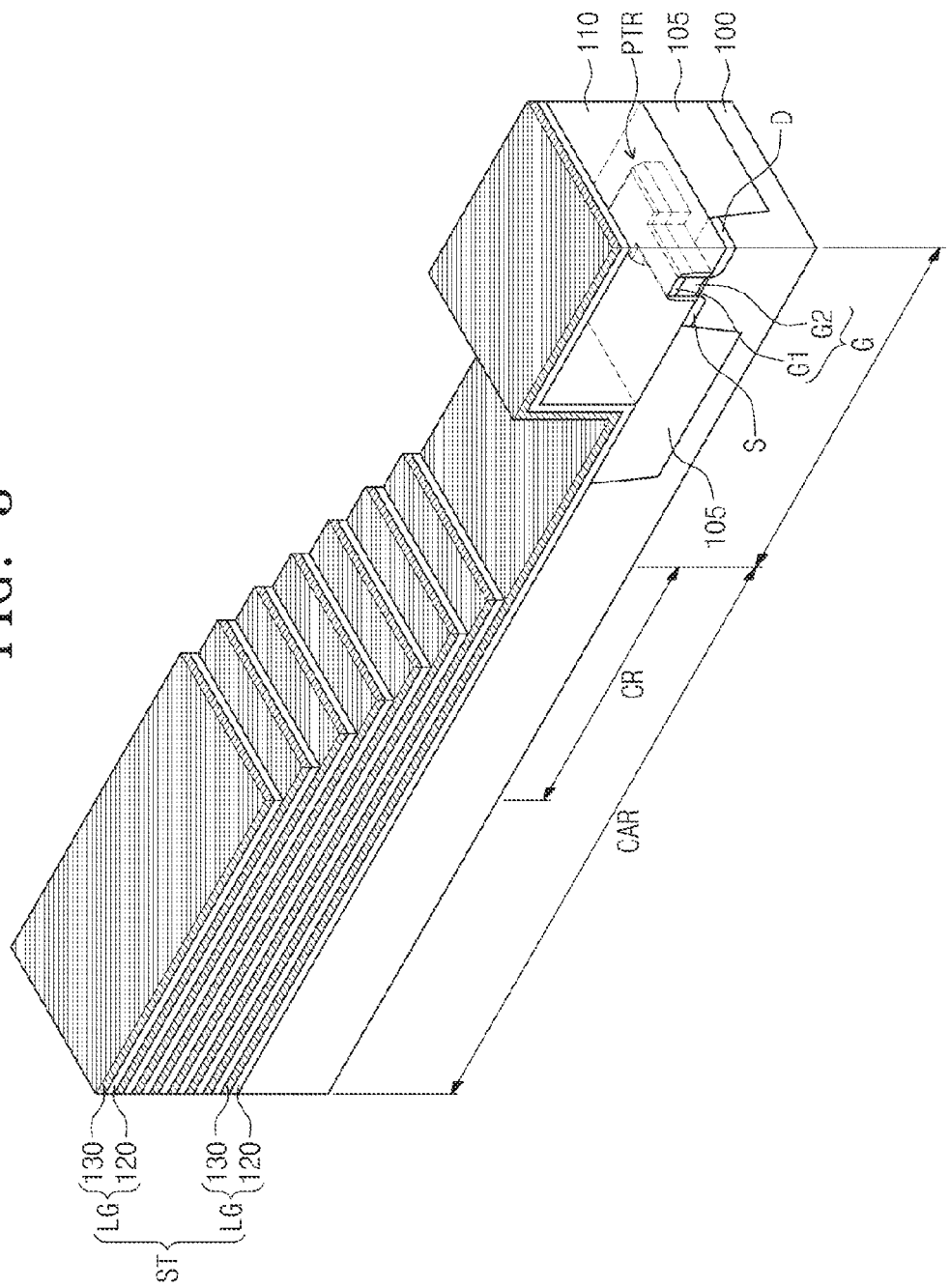

Referring to FIG. 3, the stack ST is patterned to form a staircase-shaped portion at a connection region CR of the device. For example, the stack ST may be patterned in such a way that the silicon layers 130 are respectively exposed at different locations in the connection region CR. In the illustrated embodiment, the connection region CR is located at an edge of the cell array region CAR.

In an example of this process, the stack ST is patterned by forming a mask (not shown) on the stack ST, etching the stack ST using the mask as an etch mask, etching the mask (to remove a length thereof in the horizontal direction) to form a trimmed mask (not shown), and then, re-etching the stack ST using the trimmed mask as an etch mask.

In another example of this embodiment, the stack ST is patterned by performing a plurality of etching steps in which different etch masks are used. In this case, if all of the etch masks were viewed in plan, at least one region would be covered in common with (i.e., overlapped by) the etch masks but regions exposed by the etch masks would not be identical to each other. Furthermore, the etching steps are controlled in such a way that depths to which the stack ST is etched during the steps are different from each other (shallower in succession). Also, at least the lowermost one of the layer groups LG is not etched during this process, as shown in FIG. 3, so that the top surface of the substrate 100 is not exposed.

Figure 4:
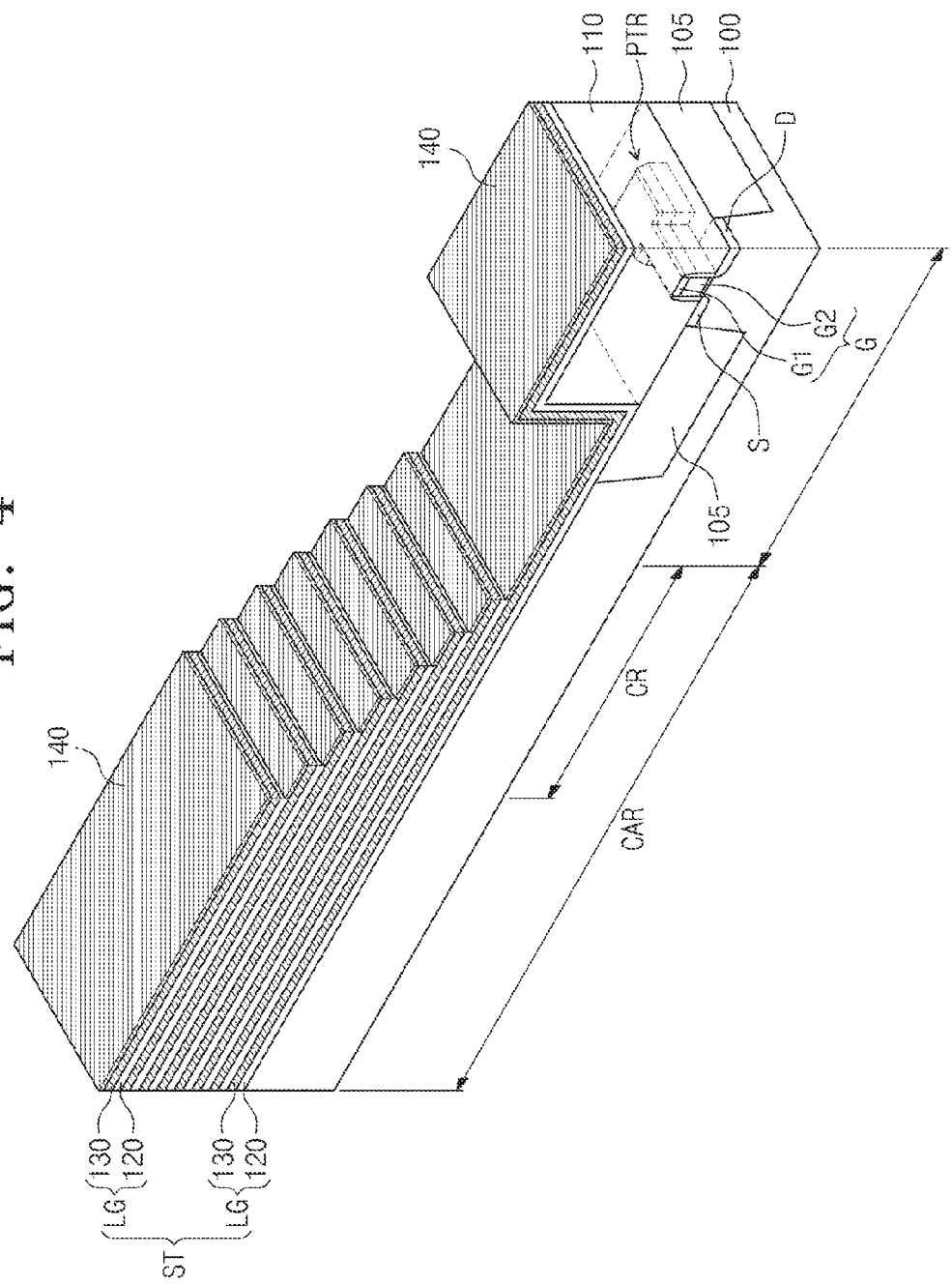

Referring to FIG. 4, lower buffer patterns 140 may be formed on the exposed top surfaces of the silicon layers 130, respectively. In this case, the lower buffer patterns 140 may be formed by a selective epitaxial process, in which the exposed top surfaces of the silicon layers 130 are used as a seed layer. That is, the lower buffer patterns 140 may be locally formed on the exposed top surfaces of the silicon layers 130.

Furthermore, each of the lower buffer patterns 140 may be formed to have a thickness (T3 in FIG. 10) smaller than the smallest value of the thicknesses (T1) of the interlayer insulating layers 120. For example, the thickness of each of the lower buffer patterns 140 may range from 0.1 times to 0.8 times (both inclusive) the thicknesses of the insulating layers 120.

Figure 5:
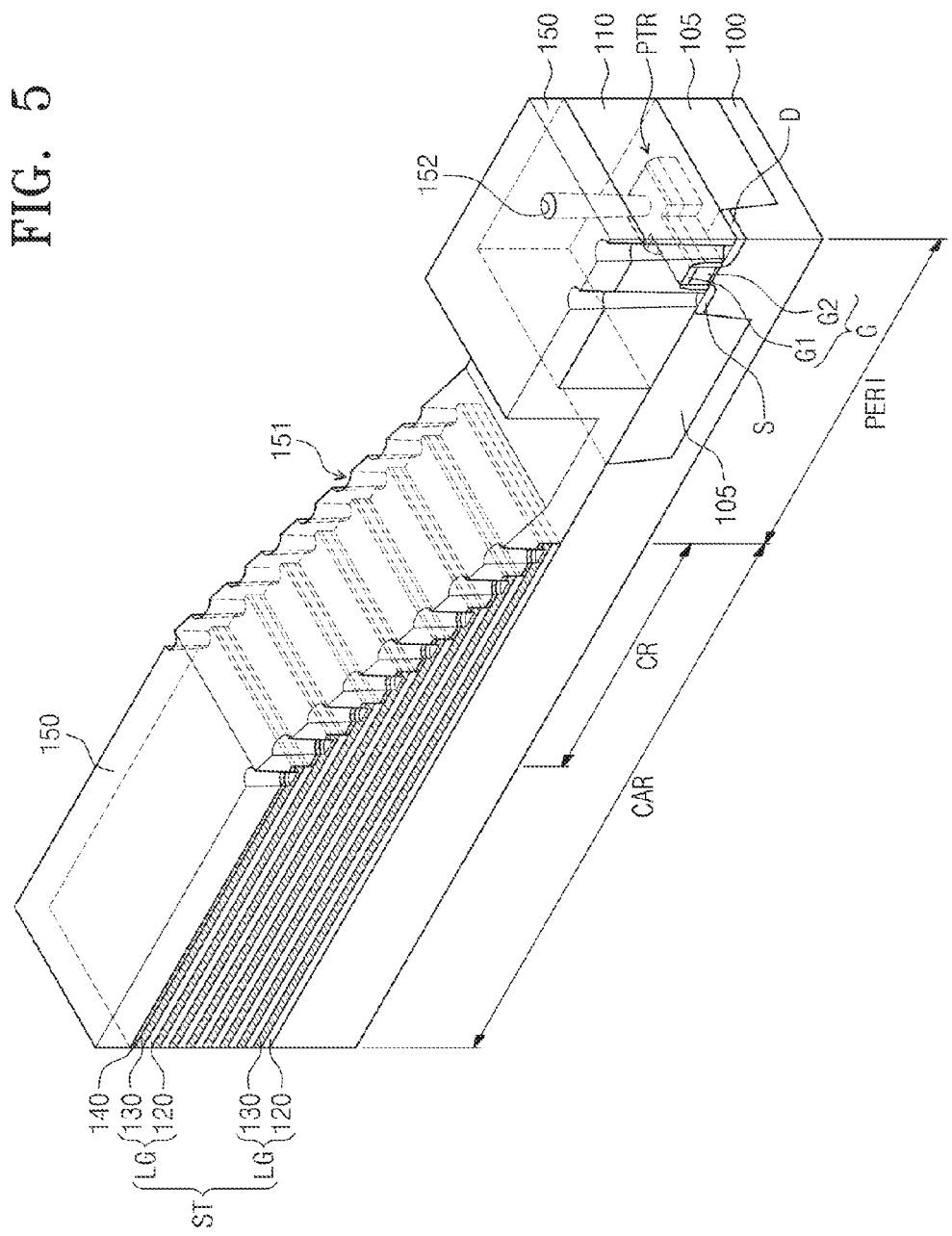

Referring to FIG. 5, at least the lowermost one of the layer groups LG is patterned to expose part of the top surface of the substrate 100.

Next, a first upper insulating layer 150 is formed on the structure having the lower buffer patterns 140. The first upper insulating layer 150 may be formed to conformally cover the structure having the lower buffer patterns 140, and the thickness thereof may be in a range of 1-10 times that of each of the layer groups LG. The first upper insulating layer 150 may include at least one of a silicon oxide layer, a silicon nitride layer, or a silicon oxynitride layer. That is, the first upper insulating layer 150 may be a single- or multi-layered structure.

Subsequently, buffer openings are formed through the first upper insulating layer 150. The buffer openings may include cell buffer openings 151, which are formed in the connection region CR to expose the lower buffer patterns 140, respectively, and peripheral buffer openings 152, which are formed in the peripheral circuit region PERI to expose the peripheral transistor PTR. For example, the peripheral buffer openings 152 may penetrate the first upper insulating layer 150 and the lower insulating pattern 110 and expose the peripheral transistor PTR. The cell and peripheral buffer openings 151 and 152 may be formed using a photolithography process.

In an example of this embodiment, the cell and peripheral buffer openings 151 and 152 are simultaneously formed by the same patterning process. Alternatively, the cell and peripheral buffer openings 151 and 152 are sequentially formed using different patterning processes. In still another example, the peripheral buffer openings 152 may be formed by a first patterning step and a second patterning step, and one of the first and second patterning steps may concurrently form the cell buffer openings 151.

In any case, the peripheral buffer openings 152 expose at least one of the gate, source, and drain electrodes G, S, and D of the peripheral transistor PTR. In an example of this embodiment, each of the lower buffer patterns 140 is exposed by two or more of the cell buffer openings 151 spaced apart from each other.

Also, in the example as shown in FIG. 5, each of the cell buffer openings 151 is cylindrical, i.e., has a circular cross section, and has an aspect ratio ranging from 0.7 to 1.3 (both inclusive), for example. Alternatively, each of the cell buffer openings 151 may have a cross section in the shape of a bar, which is elongated in a direction parallel to the lower buffer patterns 140. In this case, each of the cell buffer openings 151 has an aspect ratio ranging from 0.001 to 0.5 (both inclusive) or from 2 to 1000 (both inclusive).

In another example of this embodiment, the lower buffer patterns 140 are omitted. In this case, the first upper insulating layer 150 is formed directly on the silicon layers 130, and the cell buffer openings 151 are formed to expose the silicon layers 130.

Figure 6:
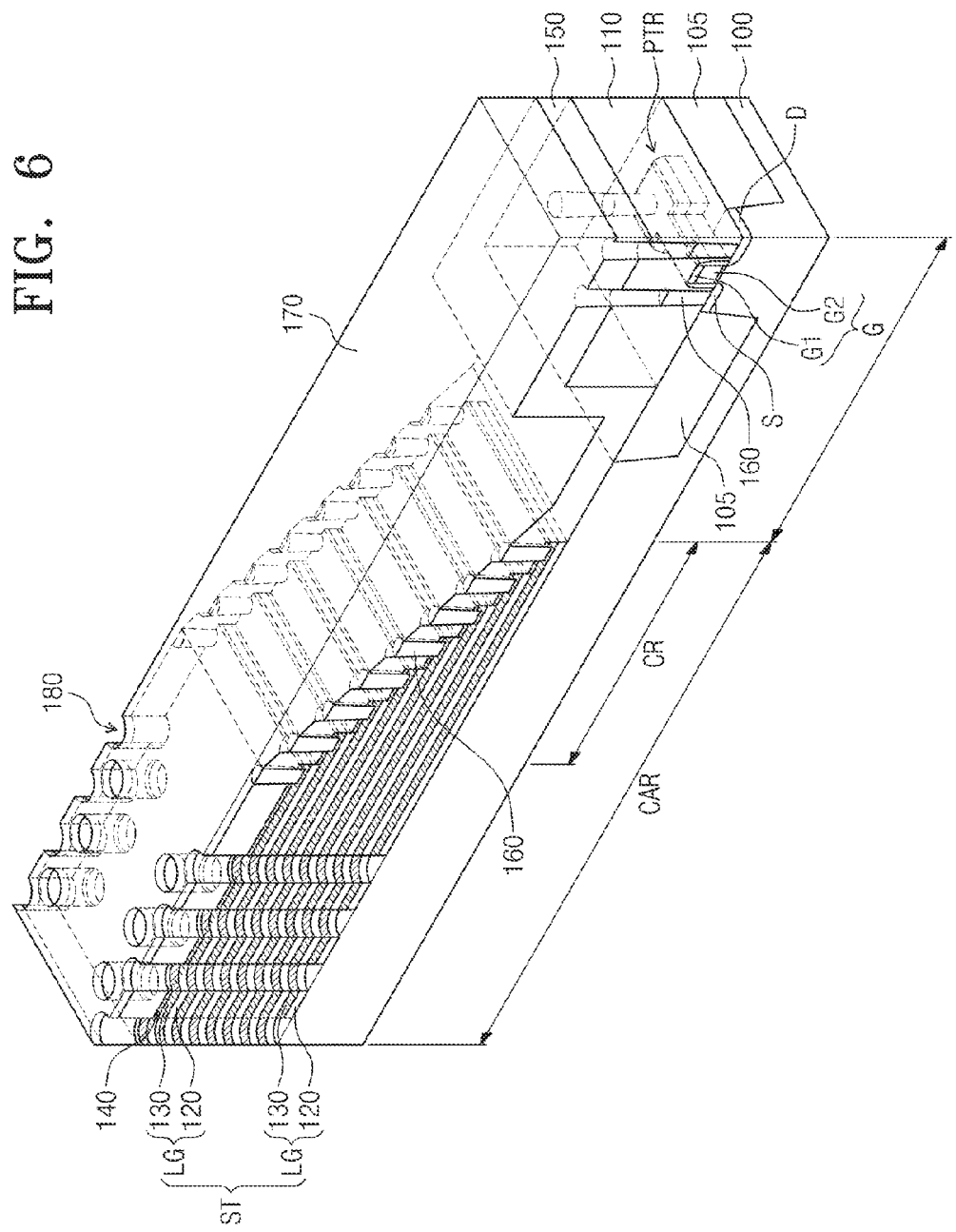

Referring to FIG. 6, upright buffer patterns 160 (referred to hereinafter as upper buffer patterns with respect to this example) are formed with a impurity dopants to exhibit conductivity in the cell and peripheral buffer openings 151 and 152. The upper buffer patterns 160 may be formed by a selective epitaxial process, in which portions exposed by the cell and peripheral buffer openings 151 and 152 are used as a seed layer. For example, the lower buffer patterns 140 exposed by the cell buffer openings 151 may be used as the seed layer for forming the upper buffer patterns 160 in the cell array region CAR or the connection region CR, while the gate, source, and drain electrodes G, S, and D of the peripheral transistor PTR exposed by the peripheral buffer openings 152 may be used as the seed layer for forming the upper buffer patterns 160 in the peripheral circuit region PERI. Accordingly, there is no difference in shape or structure between the upper buffer patterns 160 in the connection region CR and the upper buffer patterns 160 in the peripheral circuit region PERI (in the case in which the lower buffer pattern 140 is provided in the peripheral circuit region PERI).

Figure 12:
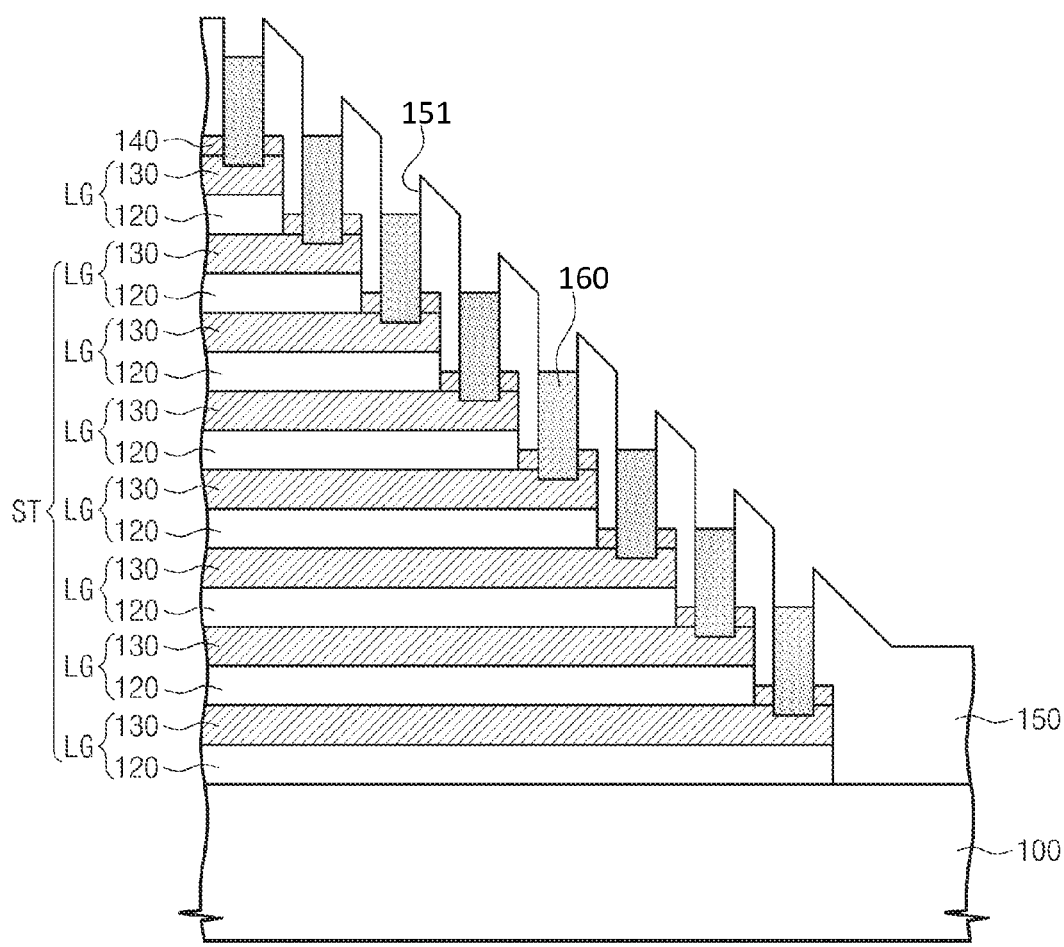
Figure 14:
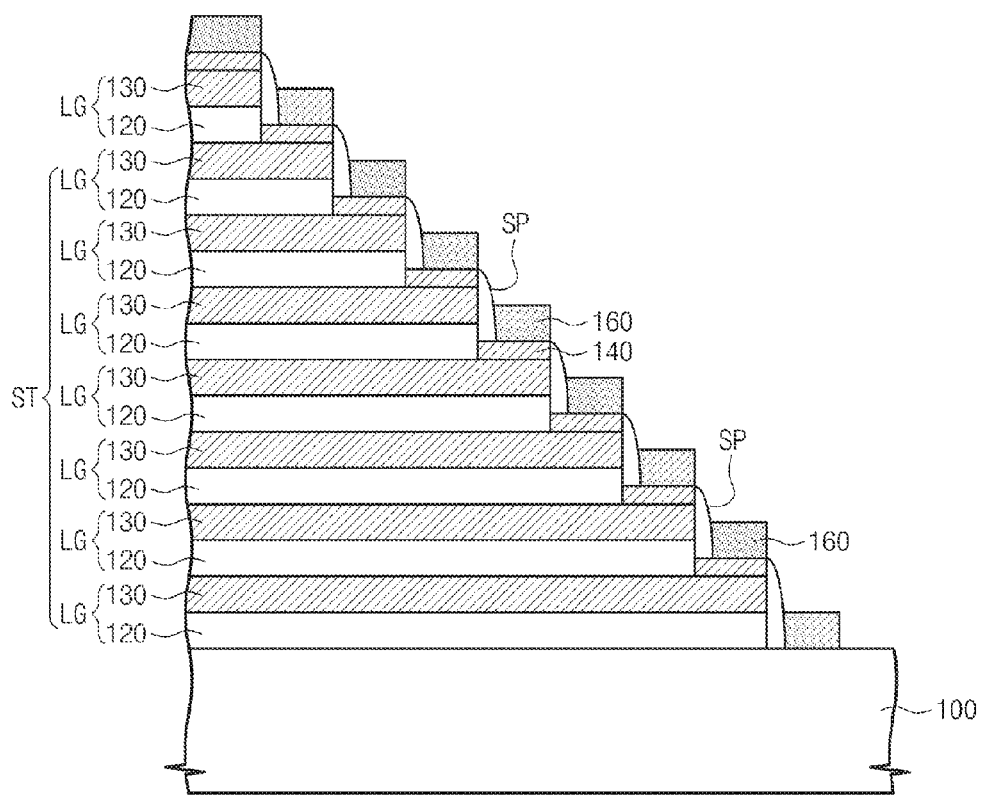

The upper buffer patterns 160 may be formed in such a way that the top surface of each of them is positioned at a level higher than that of a corresponding one of the interlayer insulating layers 120 disposed adjacent thereto (as shown in FIG. 12 or FIG. 14). To this end, for example, each of the upper buffer patterns 160 may have a thickness ranging from 1-5 times (both inclusive) the unit group thickness UGT. Also, the upper buffer patterns 160 may be formed in such a way that the maximum thickness thereof is about 1-20 times (both inclusive) the thicknesses of the silicon layer 130. Alternatively, the lower and upper buffer patterns 140 and 160 may be formed in such a way that a sum of thicknesses thereof is in a range of about 1-20 times (both inclusive) the thicknesses of the silicon layers 130.

Subsequently, a second upper insulating layer 170 is formed on the structure provided with the upper buffer patterns 160, and channel holes 180 are formed through the first and second upper insulating layers 150 and 170 and the stack ST. The second upper insulating layer 170 may be planarized or otherwise formed to have a flat top surface. In this case, the thickness of the second upper insulating layer 170 is maximum between the connection region CR and the peripheral circuit region PERI and minimum in the cell array region CAR. Also, a two-dimensional array of the channel holes 180 may be formed in the cell array region CAR.

Figure 7:
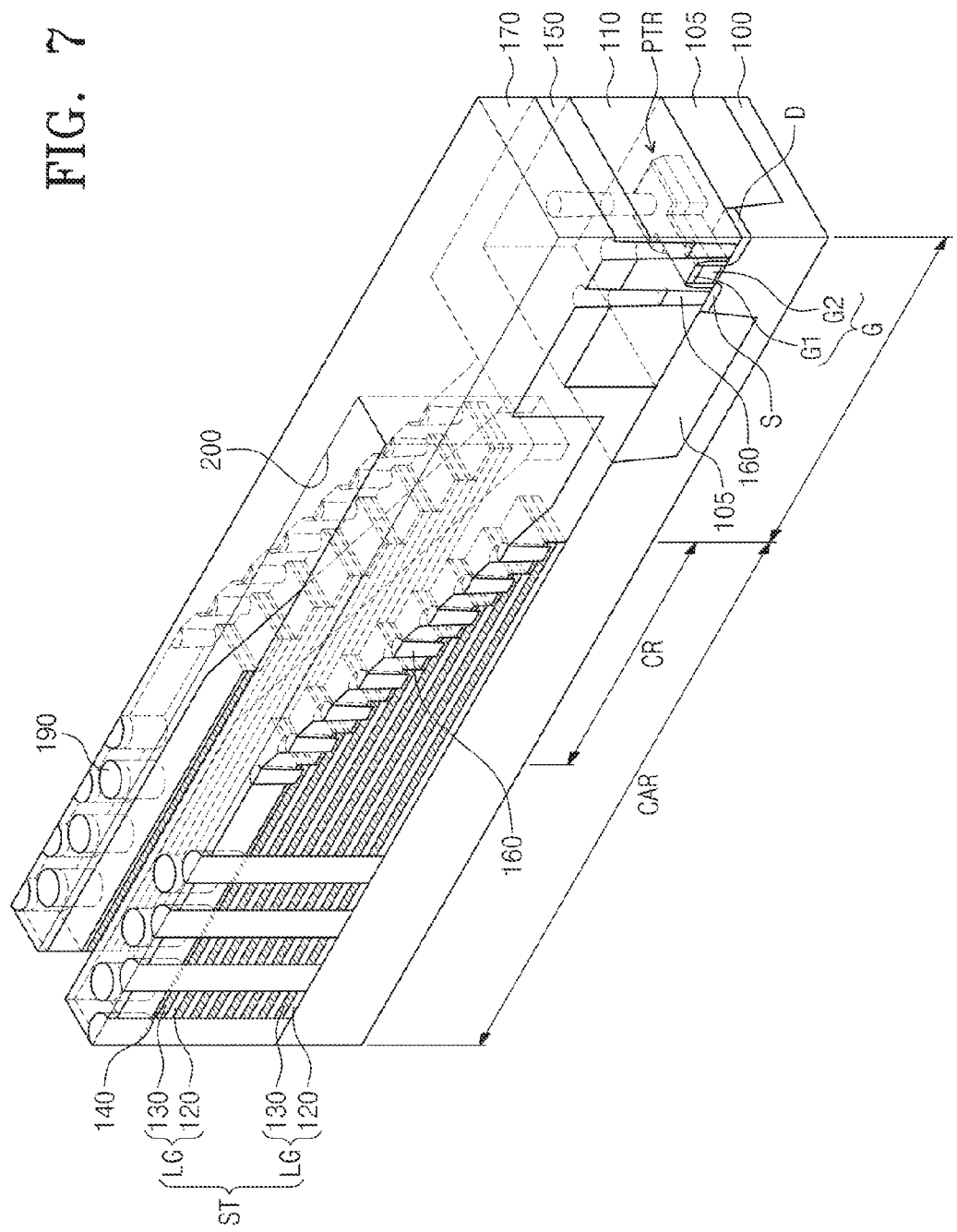

Referring to FIG. 7, vertical patterns 190 are formed by filling the channel holes 180, and a cut or recess 200 may be formed in the stack ST.

The structure of the vertical patterns 190 will generally depend on the type of three-dimensional semiconductor device being fabricated. Some possible examples of the three-dimensional semiconductor devices and the structures of their vertical patterns 190 will be described in more detail with reference to FIGS. 28 through 33.

The cut or recess 200 may be formed to cross the cell array region CAR. Accordingly, sidewalls of the silicon layers 130 and the interlayer insulating layers 120 are exposed by the cut or recess 200.

Figure 8:
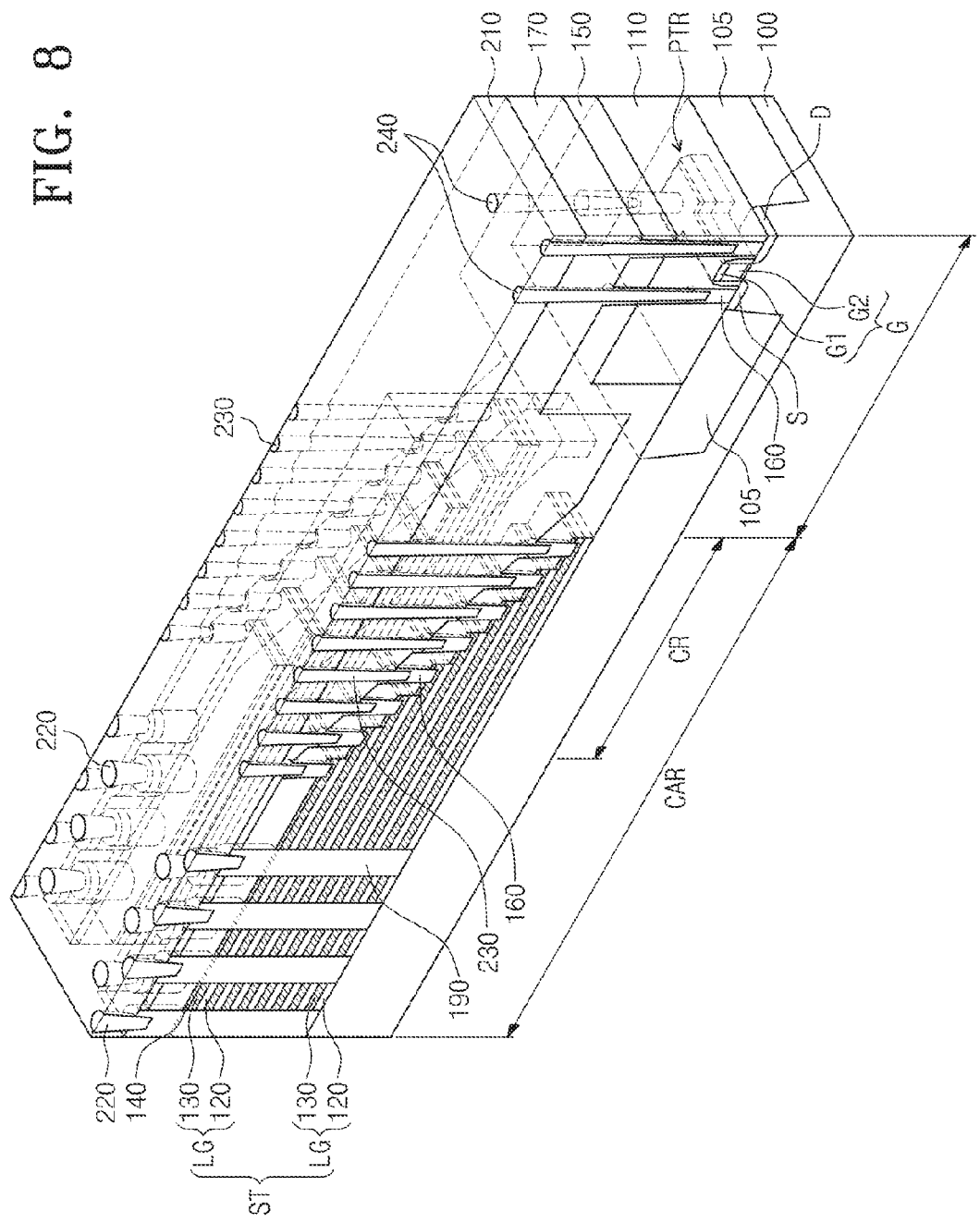

Referring to FIG. 8, contact plugs are formed as connected to the vertical patterns 190 and the upper buffer patterns 160.

However, in an example of this embodiment, before such contact plugs are formed, a replacement process is performed to replace the silicon layers 130 of the stack ST with conductive patterns comprising a metallic material. The replacement process (FIGS. 22 through 26) may include removing parts of each of or the entirety of the silicon layers 130 exposed by the cut or recess 200 to form interlayer gap regions IGR between the interlayer insulating layers 120, and then forming metallic patterns in the interlayer gap regions IGR.

The contact plugs may include cell plugs 220, connection plugs 230, and peripheral plugs 240. In this case, the cell plugs 220 are coupled to the vertical patterns 190, respectively, and the connection plugs 230 are coupled to the upper buffer patterns 160, respectively, in the connection region CR, and the peripheral plugs 240 are coupled to the upper buffer patterns 160, respectively, of the peripheral transistor PTR. In an example of this embodiment, the cell, connection, and peripheral plugs 220, 230, and 240 are simultaneously formed by the same process, but the inventive concept is not so limited thereto. Rather, as an alternative, the respective groups of cell, connection, and peripheral plugs 220, 230, and 240 may be independently formed using different patterning processes. Alternatively, at least one of the groups of cell, connection, and peripheral plugs 220, 230, and 240 may be formed by using part of a patterning process used to form another of the groups.

In one example of the patterning process for forming the contact plugs 220, 230, and 240, a third upper insulating layer 210 is formed on the second upper insulating layer 170, contact holes are formed through the second and third upper insulating layers 170 and 210, and then the contact holes are filled with a conductive material. In the case of the peripheral plugs 240, the contact holes may be formed to penetrate the second and third upper insulating layers 170 and 210, the first upper insulating layer 150, and the lower insulating pattern 110. At least one of the contact holes may be formed to define a recess in (the upper surface of) a corresponding one of the upper buffer patterns 160, as shown in FIG. 8. In this case, the recess may have a depth that is larger than the smallest of the thicknesses of the silicon layers 130 and is smaller than the smallest of the thicknesses of the upper buffer patterns 160.

Figure 9:
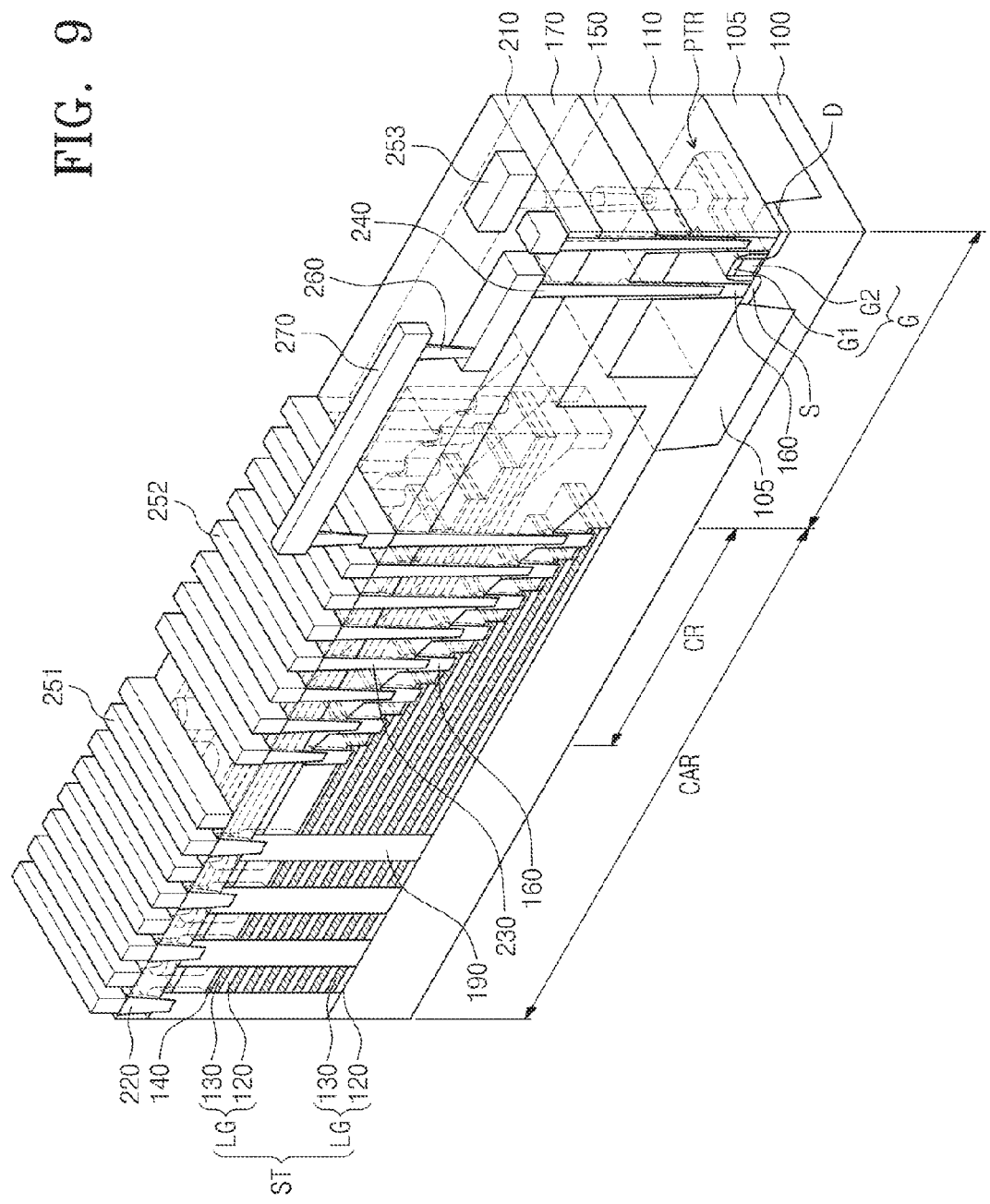

Referring to FIG. 9, an interconnection structure is formed as connected to the contact plugs 220, 230, and 240. The interconnection structure may include bit lines 251 connected to the cell plugs 220, connection patterns 252 connected to the connection plugs 230, and peripheral interconnection lines 253 connected to the peripheral plugs 240. In an example of this embodiment, the peripheral circuit region PERI includes a plurality of peripheral transistors that are electrically connected to the bit lines 251 and the connection patterns 252, and the interconnection structure further includes via plugs 260 and upper interconnection lines 270 for realizing such electric connection.

Figure 10:
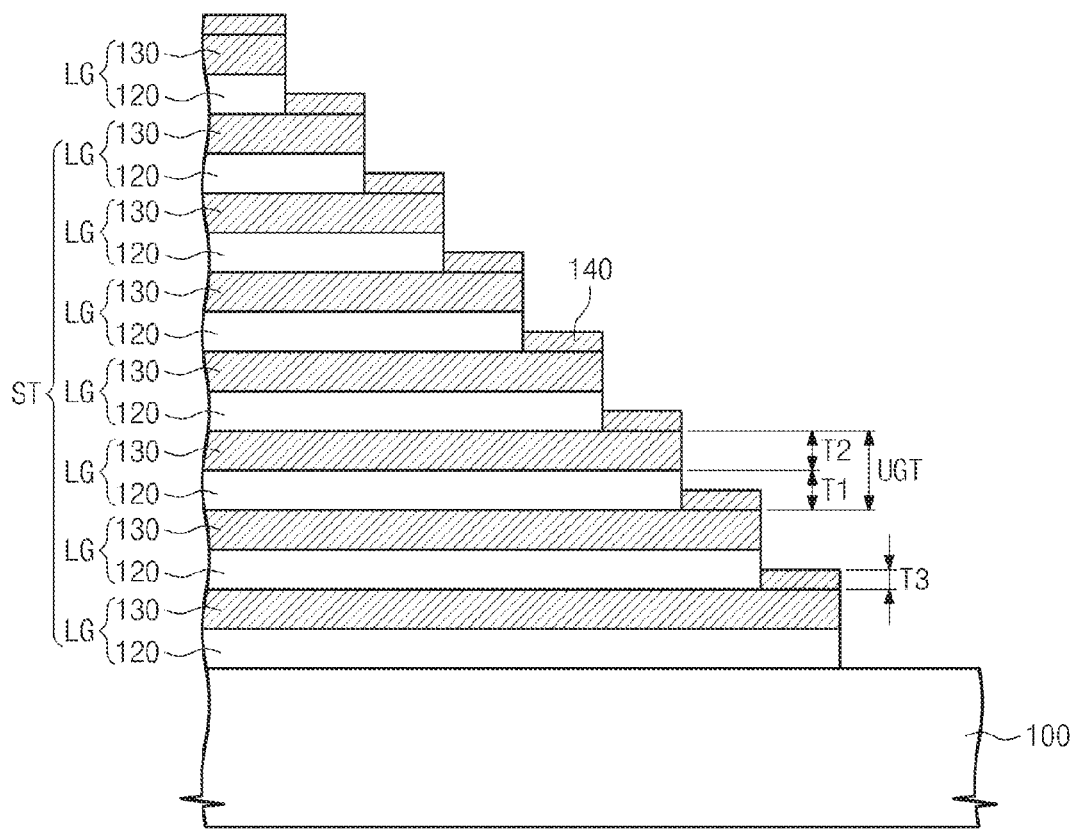
FIGS. 10, 11 and 12 are sectional views illustrating a technique of forming lower and upper buffer patterns in the embodiment of FIGS. 1-9.
Figure 11:
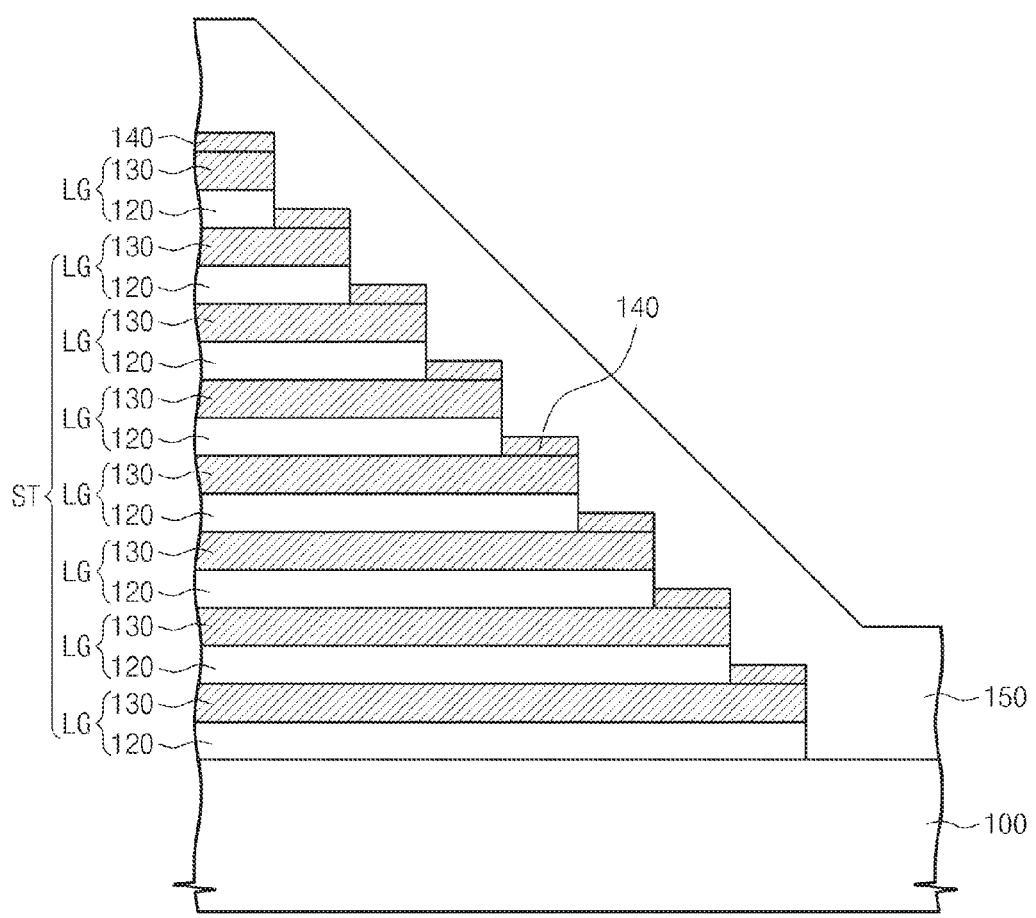

FIGS. 10 through 12 illustrate one example of a technique for forming of lower and upper buffer patterns, according to the inventive concept.

In this technique, as shown in FIG. 10 and as was referred to earlier, lower buffer patterns 140 may be formed by a selective epitaxial process in which exposed top surfaces of the silicon layers 130 are used as a seed layer. Each of the lower buffer patterns 140 may have a thickness T3 that is smaller than the unit group thickness UGT.

Subsequently, as shown in FIG. 11 and as was also referred to earlier, the first upper insulating layer 150 is conformally formed on the structure provided with the lower buffer patterns 140, and then, as shown in FIG. 12, the cell buffer openings 151 may be formed through the first upper insulating layer 150 to expose the lower buffer patterns 140, respectively.

The cell buffer openings 151 have substantially the same depth because the first upper insulating layer 150 is formed conformally and thus has the thicknesses as measured vertically from the buffer patterns 140, respectively. Accordingly, even when the stack ST has a thickness which varies in a stepwise manner in the connection region CR, the upper insulating layer 150 is not over-etched when forming the cell buffer openings 151. Therefore, each cell buffer opening 151 is prevented from penetrating a corresponding one of the silicon layers 130 disposed thereunder.

As was also mentioned earlier, as an alternative, the first upper insulating layer 150 is formed directly on the silicon layers 130, and the cell buffer openings 151 are formed to expose the silicon layers 130.

In any case, the use of a selective epitaxial process makes it possible to form the upper buffer patterns 160 locally in the cell buffer openings 151. In the illustrated example of this embodiment, each of the upper buffer patterns 160 is formed to a thickness greater than the unit group thickness UGT.

In an alternative embodiment, a height of a first buffer pattern among the upper buffer patterns 160 is less than a height of a second buffer pattern among the upper buffer patterns 160. Here, the height measured from a bottom surface of the first (or second) buffer pattern to a bottom surface of a contact plug connected to the first (or second) buffer pattern. The first buffer pattern may be located up (away from the underlying substrate) the staircase structure relative to the second buffer pattern.

In another alternative embodiment, the respective heights of the upper buffer patterns 160 increase in succession in a downward direction of the staircase structure for all or part of the staircase structure.

In another alternative embodiment, the staircase structure includes plural segments juxtaposed up and down the staircase structure, and respective heights of the upper buffer patterns vary from segment to segment. For example, respective heights of upper buffer patterns 160 may increase in succession in a downward direction within each segment of the staircase structure, and the heights of corresponding upper buffer patterns 160 may be the same from segment to segment. As a specific example, the staircase structure may include 4 segments each containing 8 upper buffer patterns 160. Within each segment, the 8 upper buffer patterns 160 may successively increase in height in a downward direction of the staircase structure. On the other hand, the heights of the 8 upper buffer patterns of one segment may respectively match those of each other segment. In this case, the upper buffer pattern 160 at the top of one segment will have a lesser height than an adjacent upper buffer pattern 160 at the bottom of an immediately adjacent segment.

Figure 13:
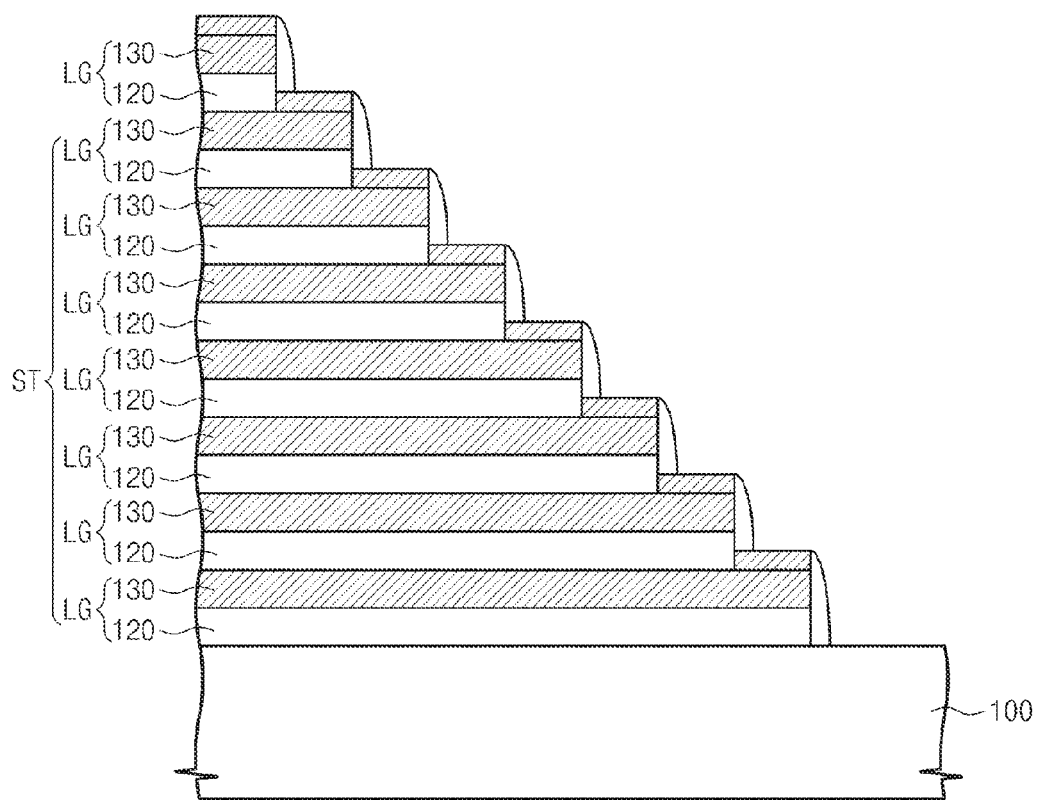
FIGS. 13 and 14 are sectional views illustrating a technique of forming upper buffer patterns in another embodiment of a method fabricating a three-dimensional semiconductor device, according to the inventive concept.

FIGS. 13 and 14 illustrate another example of a technique for forming upper buffer patterns, according to the inventive concept.

In this technique, the upper buffer patterns 160 are formed by forming a spacer SP on a sidewall of each of the layer groups LG, as shown in FIG. 13, and using the spacer SP as a mask in a selective epitaxial process, as shown in FIG. 14. The spacer SP may be formed by conformally forming a spacer insulating layer on the structure provided with the staircase-shaped connection region CR, and then anisotropically etching the spacer insulating layer to expose top surfaces of the lower buffer patterns 140 or the silicon layers 130. In this case, during the selective epitaxial process, the upper buffer patterns 160 are grown from the exposed top surfaces of the lower buffer patterns 140 or the silicon layers 130. Furthermore, in this example, each of the upper buffer patterns 160 may be formed to have a thickness smaller than the unit group thickness UGT.

Figure 21:
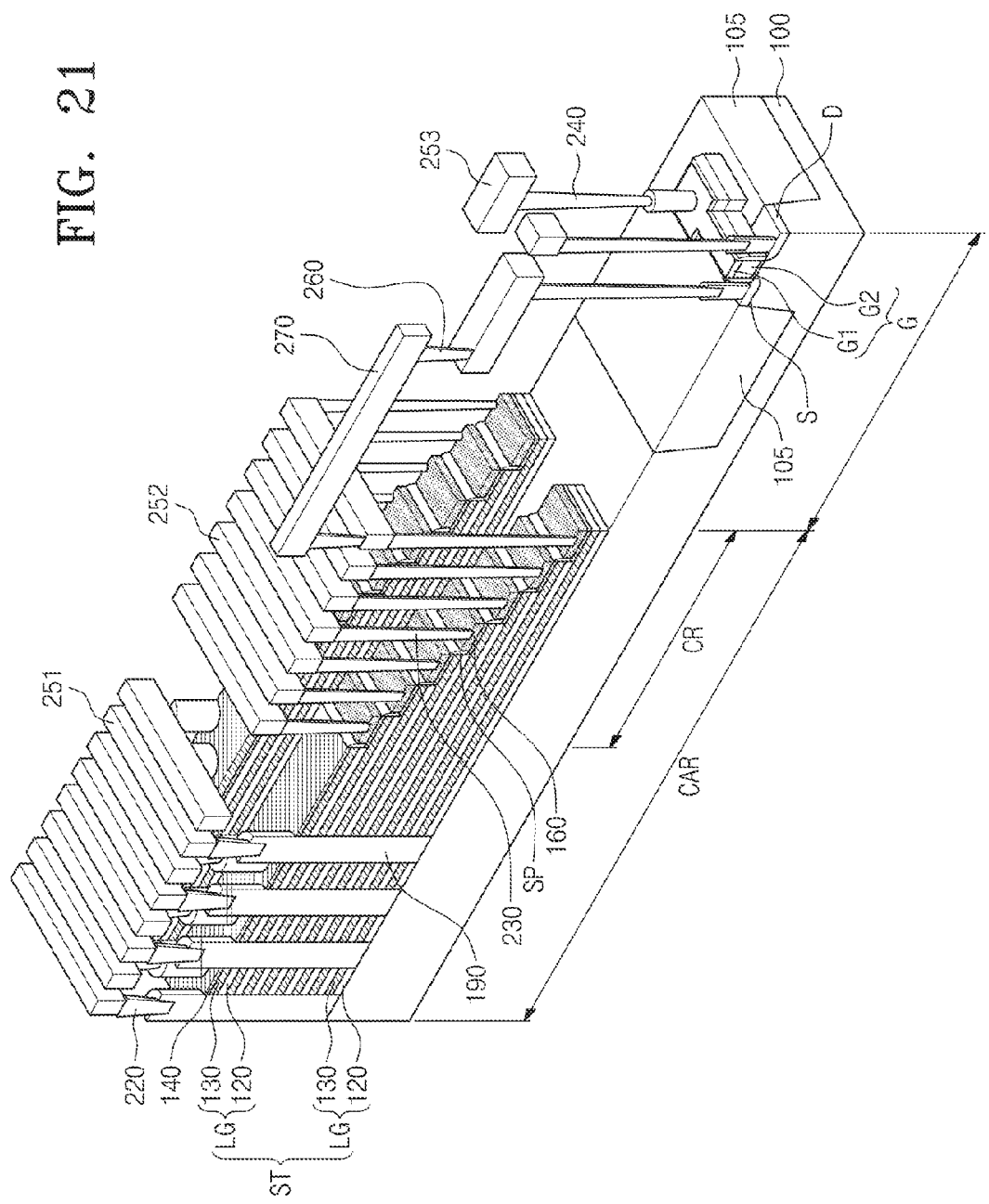
FIG. 21 is a perspective view illustrating another embodiment of a three-dimensional semiconductor device, according to the inventive concept.

Such a use of the spacer SP makes it possible to form the upper buffer patterns 160 without a photolithography process. Furthermore, the spacer SP is used as the mask in the selective epitaxial growth process. Accordingly, each of the upper buffer patterns 160 has a relatively large footprint. This aspect of the embodiment is especially well-illustrated in FIG. 21.

Figure 15:
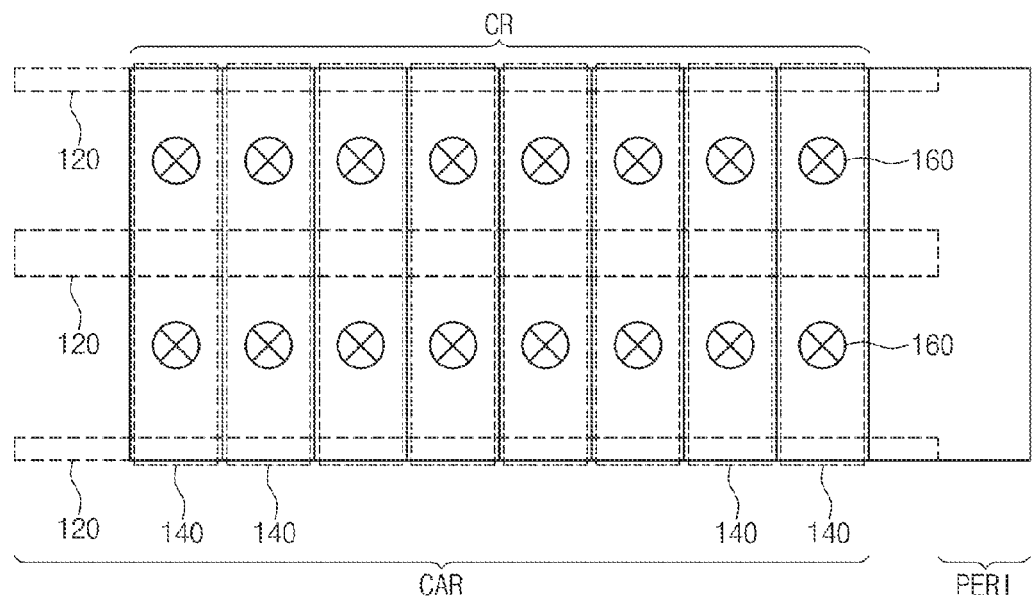
FIGS. 15, 16 and 17 are plan views of respective examples of shapes and layouts of upper buffer patterns, in three-dimensional semiconductor devices according to the inventive concept.
Figure 16:
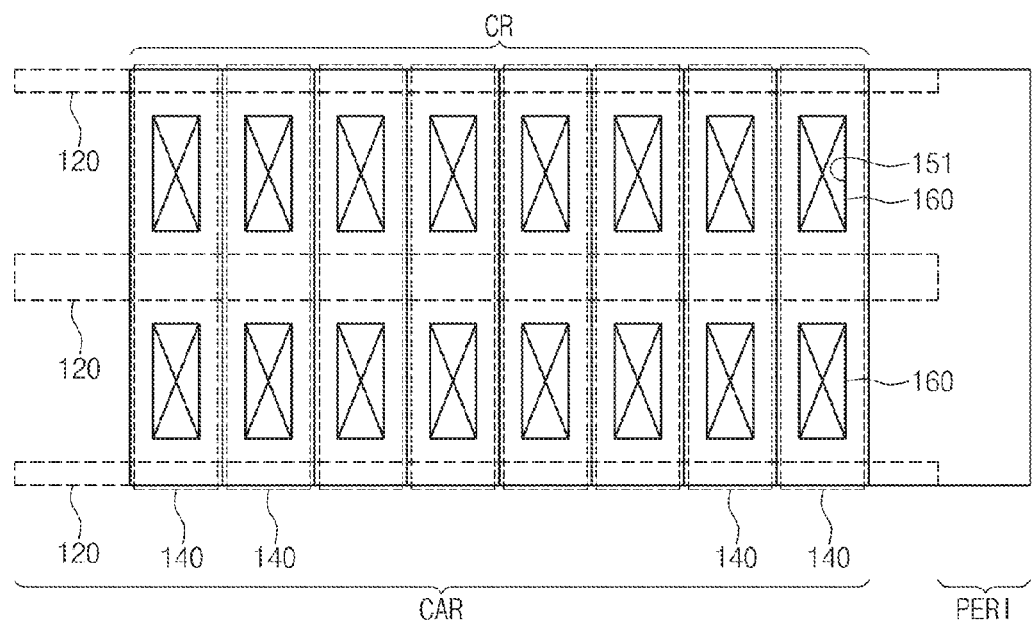
Figure 17:
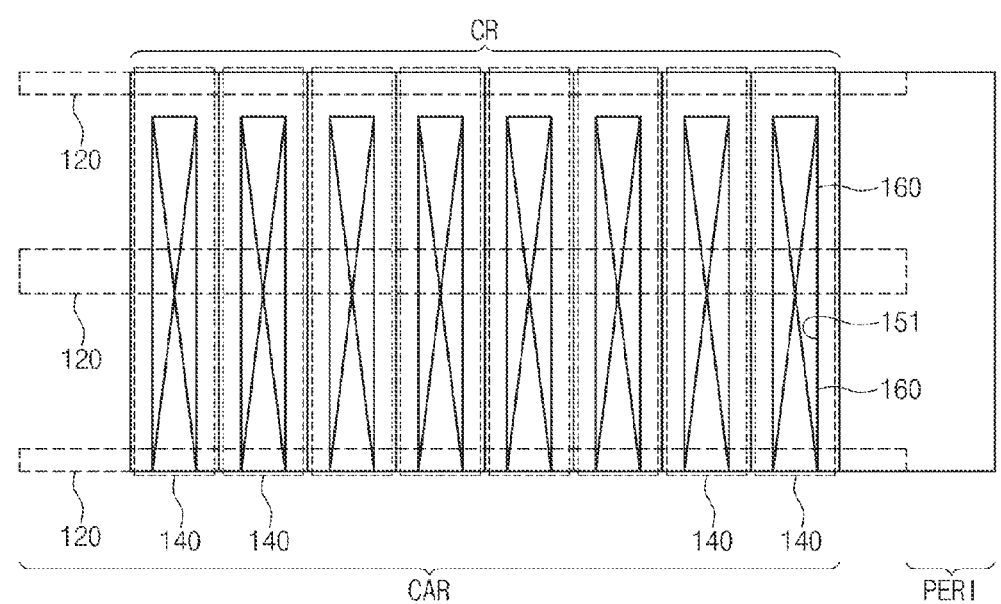
Figure 18:
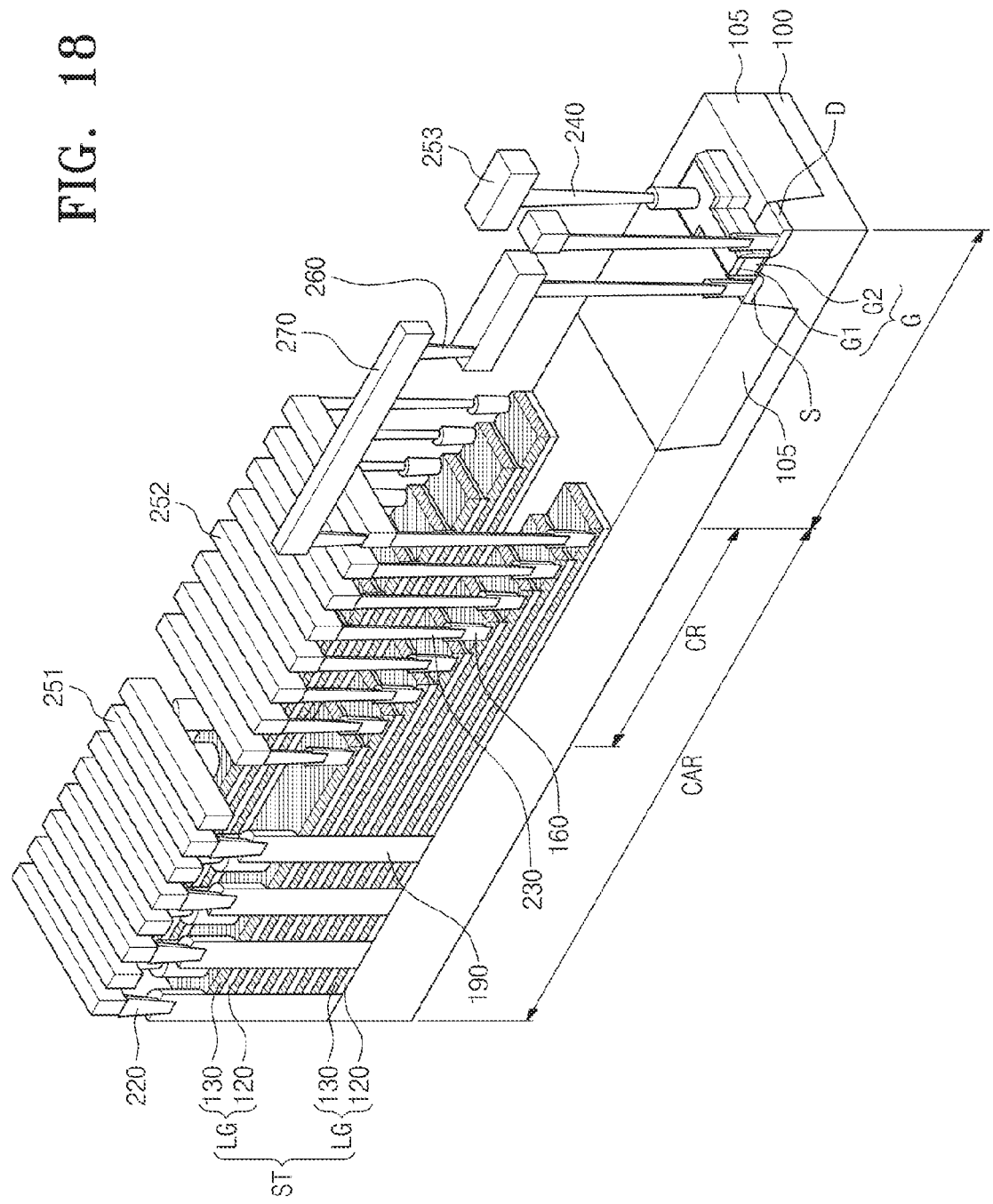
FIGS. 18, 19 and 20 are perspective views of the three-dimensional semiconductor devices having the buffer patterns illustrated in FIGS. 15, 16 and 17, respectively.
Figure 19:
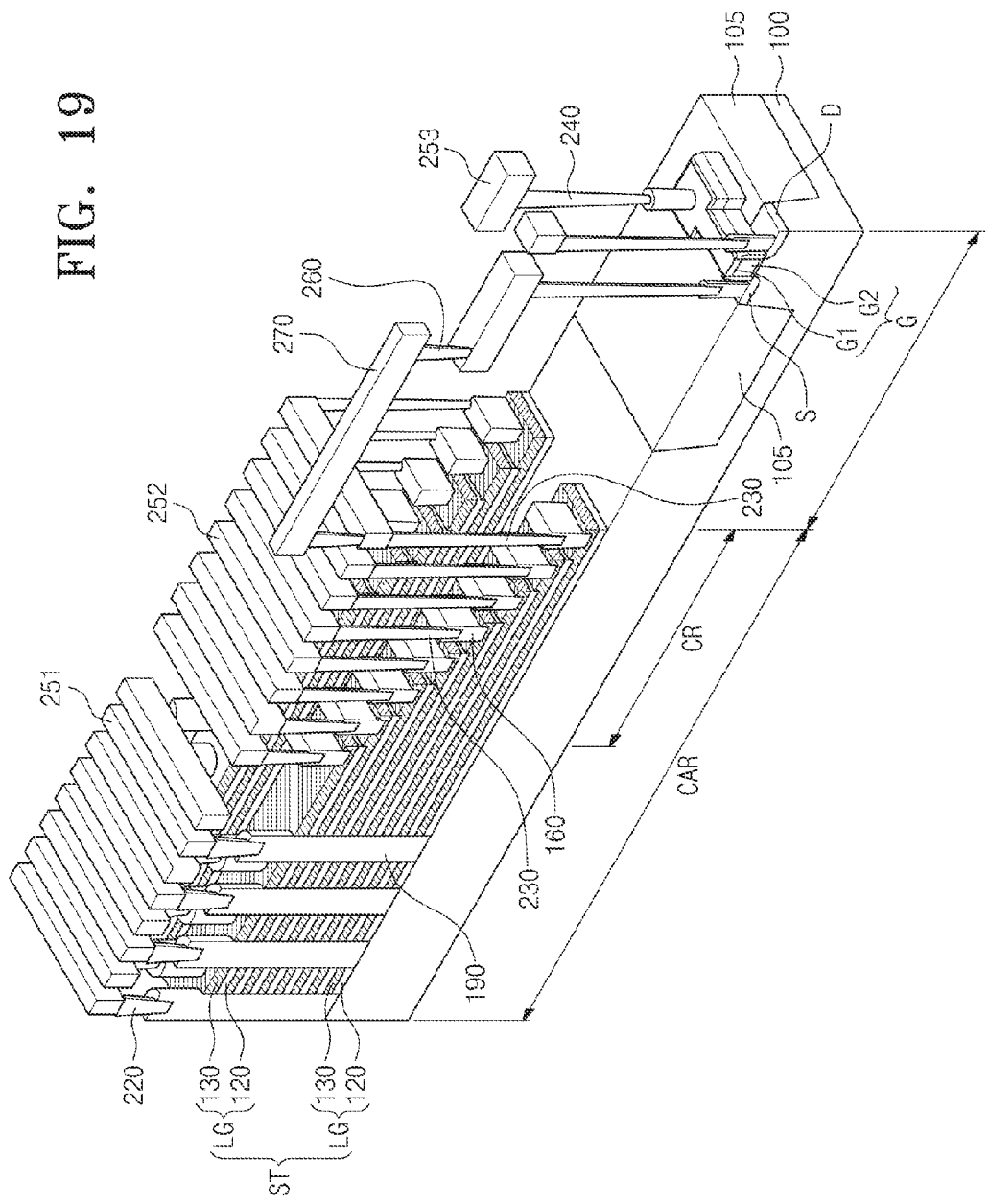
Figure 20:
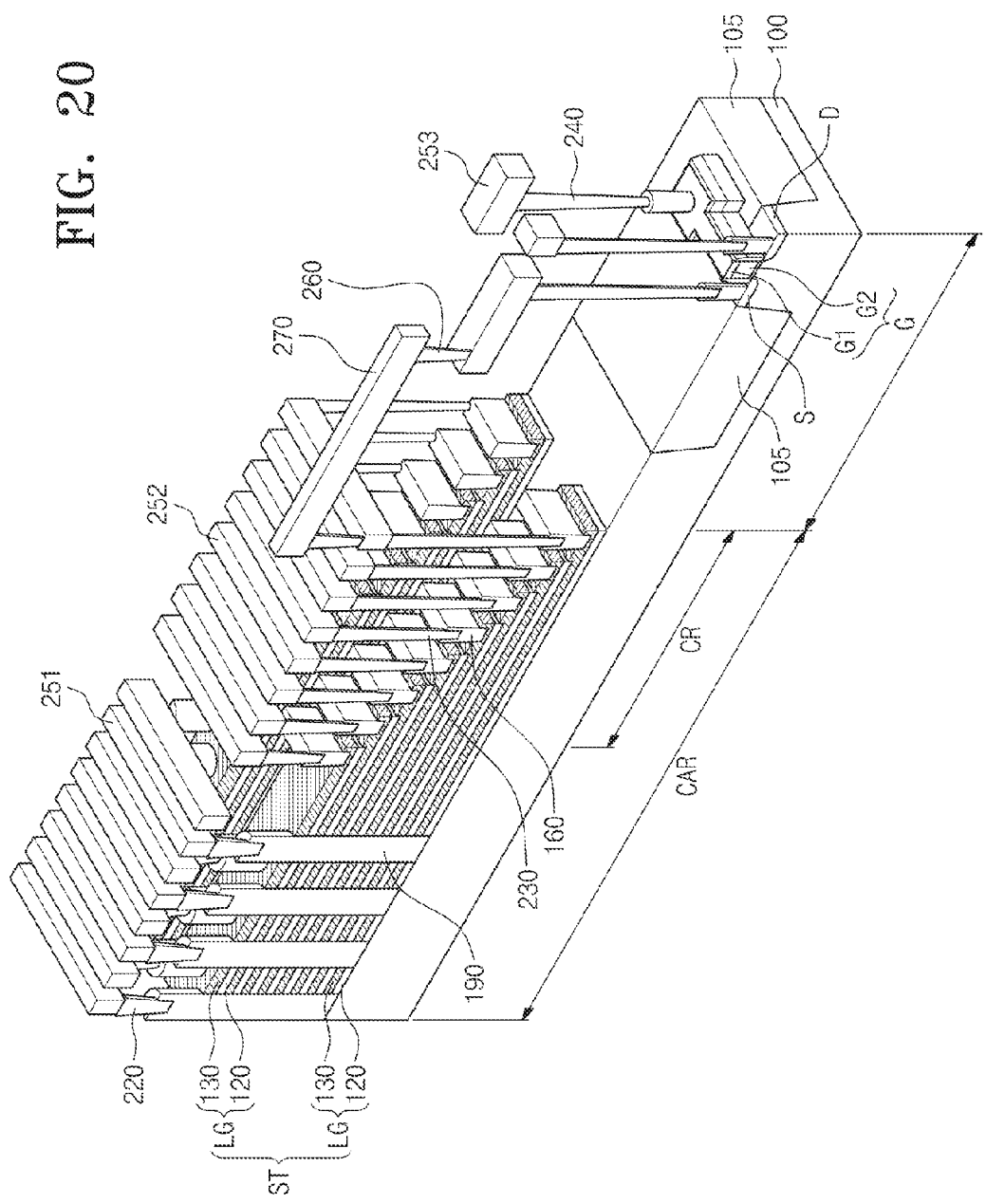

FIGS. 15 through 17 illustrate the shapes and layout of upper buffer patterns of embodiments of a three-dimensional semiconductor device, according to the inventive concept. FIGS. 18 through 20 are perspective views of these three-dimensional semiconductor devices, respectively.

As shown best in FIGS. 15 through 17, each of the lower buffer patterns 140 have substantially the same area (footprint) as that of each step (tread) of the staircase-structure in the connection region CR. By contrast, the area (footprint) of each of the upper buffer patterns 160 is smaller than that of a corresponding one of the lower buffer patterns 140. Although not shown, in the case in which the spacer SP described with reference to FIGS. 13 and 14 is used, the area (footprint) of each of the lower buffer patterns 140 is less than that of each step (tread) of the staircase-structure in the connection region CR by an amount equal to the width (footprint) of the spacer SP.

In the examples shown in FIGS. 15 and 16, each of the upper buffer patterns 160 is spaced apart from the cut or recess 200. Furthermore, in the examples shown in FIGS. 15 and 18, each of the upper buffer patterns 160 is a cylindrical pillar and may have an aspect ratio of 0.7 to 1.3 (both inclusive). Alternatively, in the example shown in FIGS. 16 and 19, each of the upper buffer patterns 160 is a rectangular parallelepiped and may have an aspect ratio of 1.5 to 20 (both inclusive).

In the example shown in FIG. 17, each of the upper buffer patterns 160 crosses at least one cut or recess 200. For example, each of the cell buffer openings 151 for the upper buffer patterns 160 may be formed to have an aspect ratio ranging from 0.001 to 0.5 (both inclusive) or from 2 to 1000 (both inclusive). In this case, each of the upper buffer patterns 160 is divided into a plurality of portions, when the cut or recess 200 is formed. As shown in FIG. 20, each of the divided portions of the upper buffer patterns 160 may have a sidewall delimiting, or exposed by, the cut or recess 200.

FIGS. 22 through 26 illustrate an example of a replacement process, according to the inventive concept.

Figure 22:
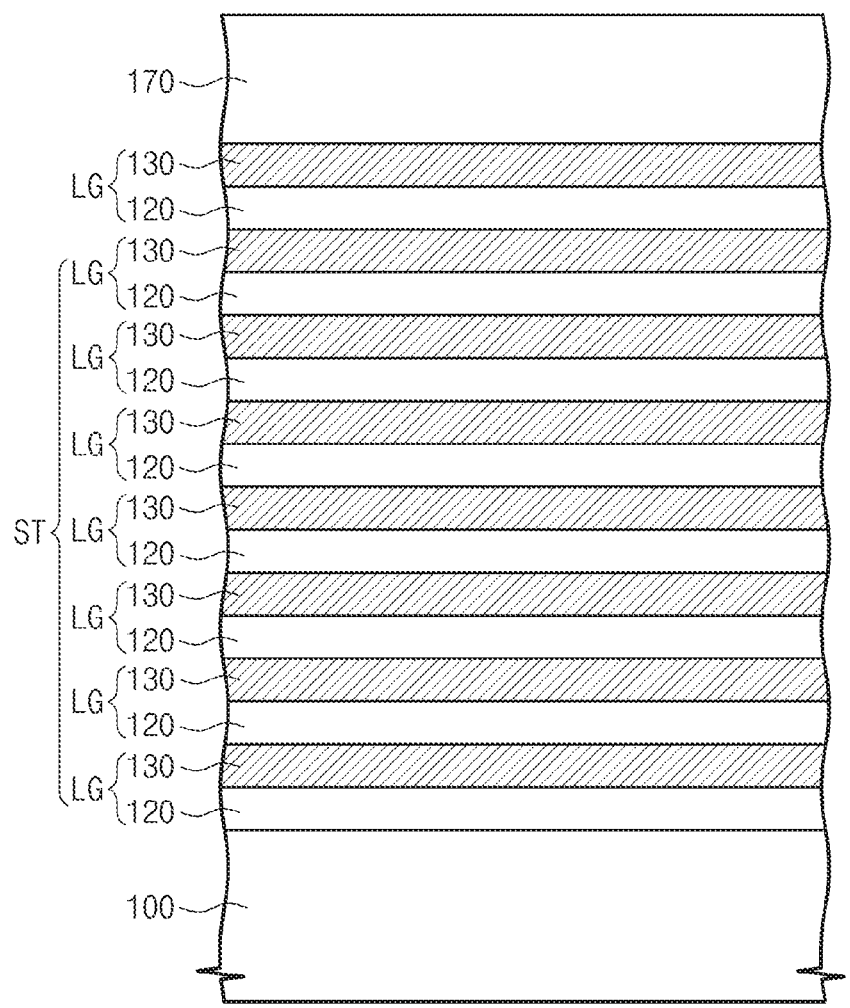
FIGS. 22, 23, 24, 25 and 26 are sectional views illustrating an example of a replacement process in an embodiment of fabricating a three-dimensional semiconductor device, according to the inventive concept.
Figure 23:
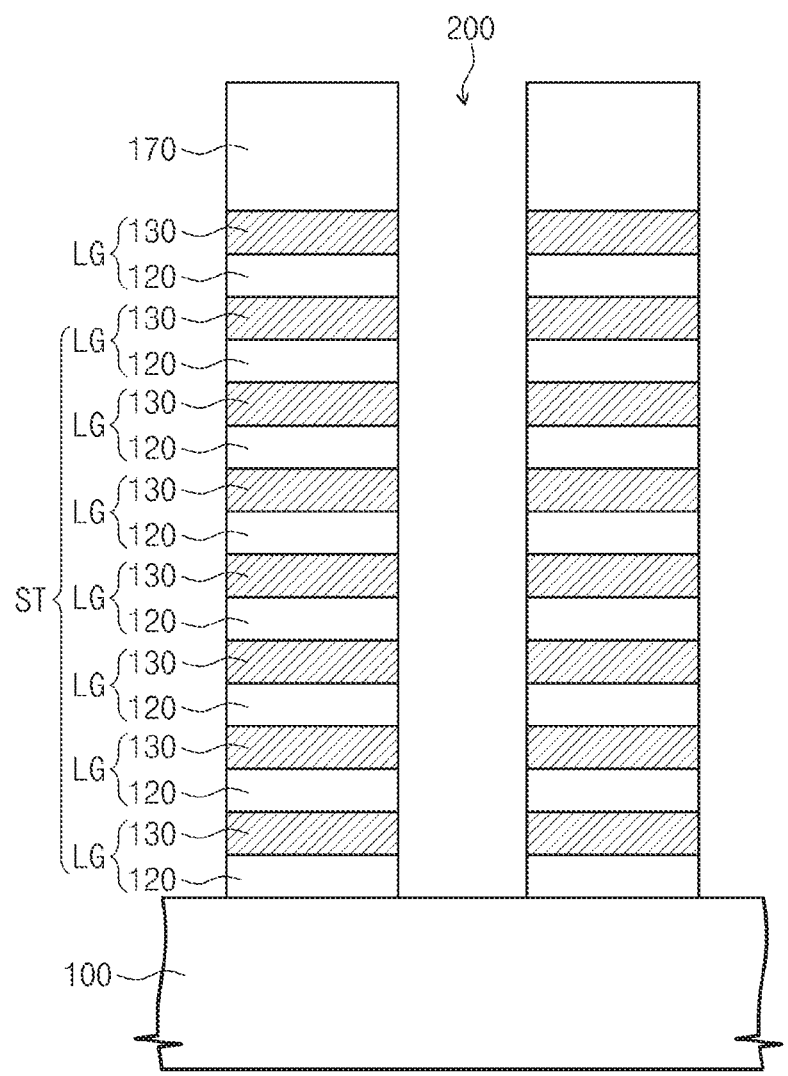

Referring to FIGS. 22 and 23, the second upper insulating layer 170 is formed on the stack ST, as described with reference to FIG. 6, and then, the cut or recess 200 is formed through the stack SR. The cut or recess 200 may be formed across the cell array region CAR. Thus, the sidewalls of the silicon layers 130 and the interlayer insulating layers 120 are exposed by the cut or recess 200.

Figure 24:
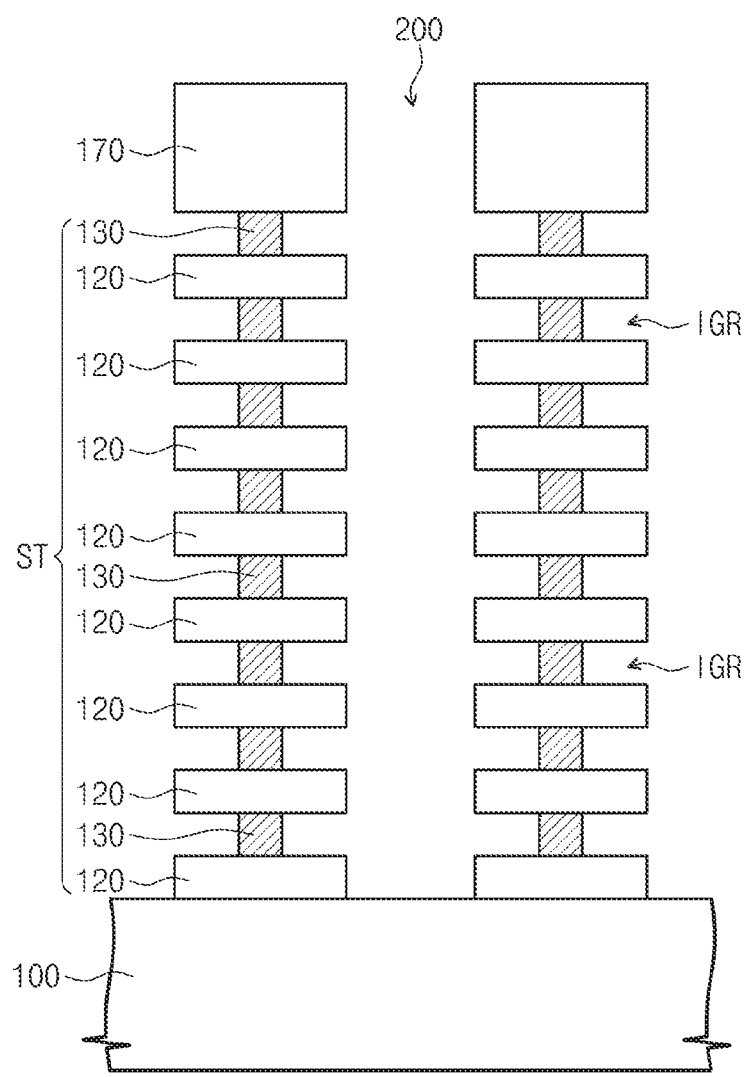

As shown in FIG. 24, the exposed sidewalls of the silicon layers 130 are recessed to form the interlayer gap regions IGR between the interlayer insulating layers 120. The recessing may be performed in such a way that respective portions of the silicon layers 130 are left between the interlayer insulating layers 120. In this case, the remaining portions of the silicon layers 130 delimit the sides of the interlayer gap regions IGR.

Figure 25:
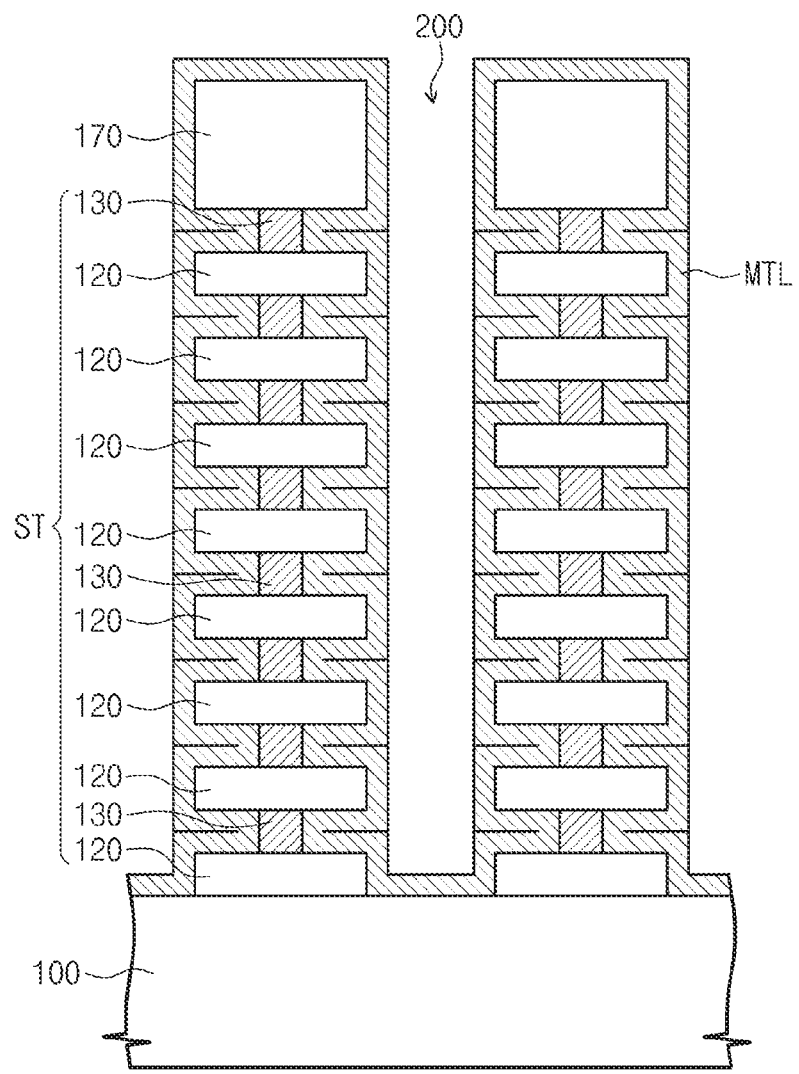
Figure 26:
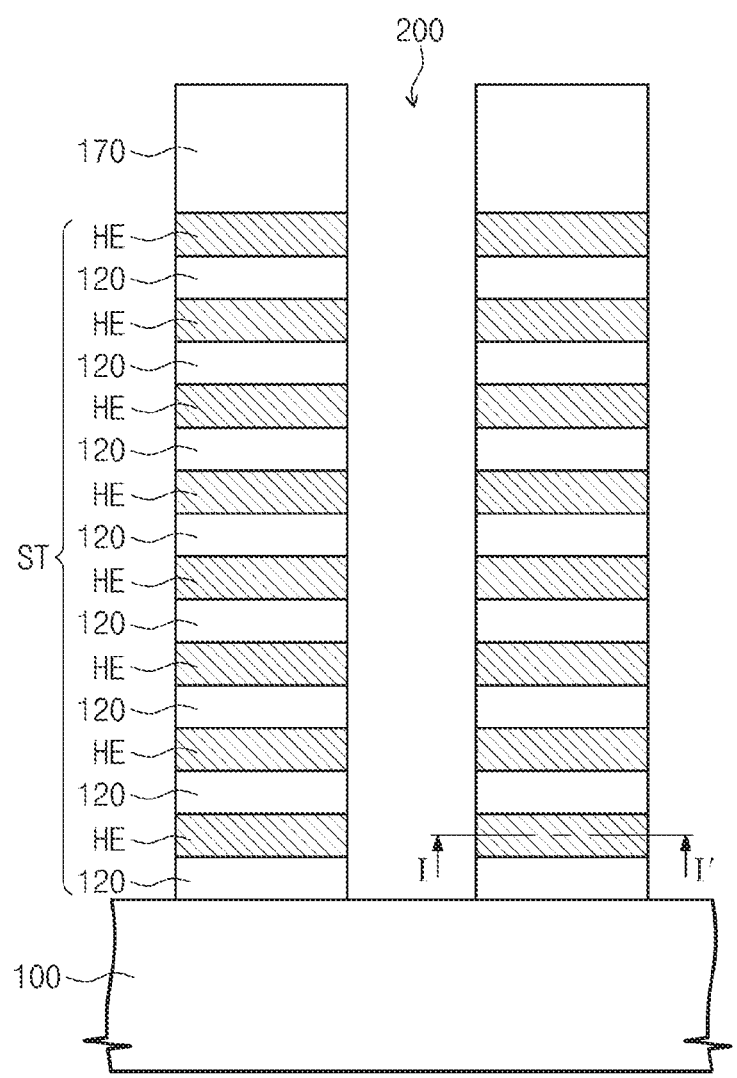

Next, as shown in FIG. 25, a metal layer MTL is formed to fill the interlayer gap regions IGR. Then, a silicidation process may be performed to react the metal layer MTL with the remaining portions of the silicon layers 130 and thereby form horizontal electrodes HE in the interlayer gap regions IGR, respectively, as shown in FIG. 26. In this case, the horizontal electrodes HE will be formed of a conductive material containing metal atoms (i.e., a metal silicide in this example).

Figure 27:
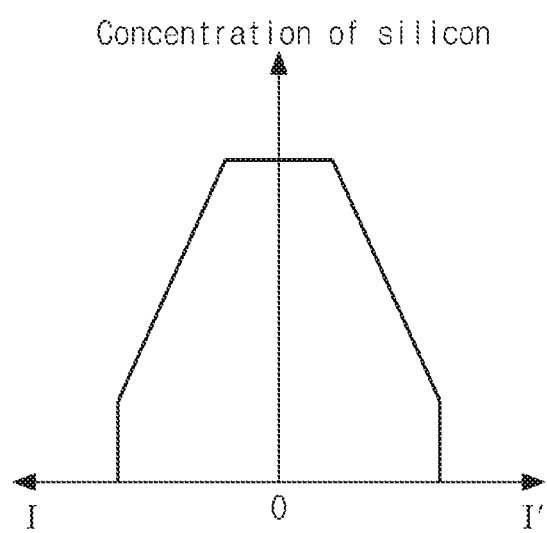
FIG. 27 is a graph of an example of a horizontal distribution of silicon atoms in a horizontal electrode along line I-I' of FIG. 26.

FIG. 27 is a graph showing a horizontal distribution of silicon atoms in an example of the horizontal electrode HE, with the distribution being in the direction of line I-I' of FIG. 26.

As described above, the horizontal electrode HE may be formed by siliciding a remaining portion of silicon layer 130 located near the center of the interlayer gap region IGR. In this case, as shown in FIG. 27, the concentration of silicon atoms is highest at the center O of the horizontal electrode HE and is lowest near the opposite sides of the horizontal electrode HE. For example, the concentration of silicon atoms gradually or monotonically decreases away from the center O of the horizontal electrode HE.

Figure 28:
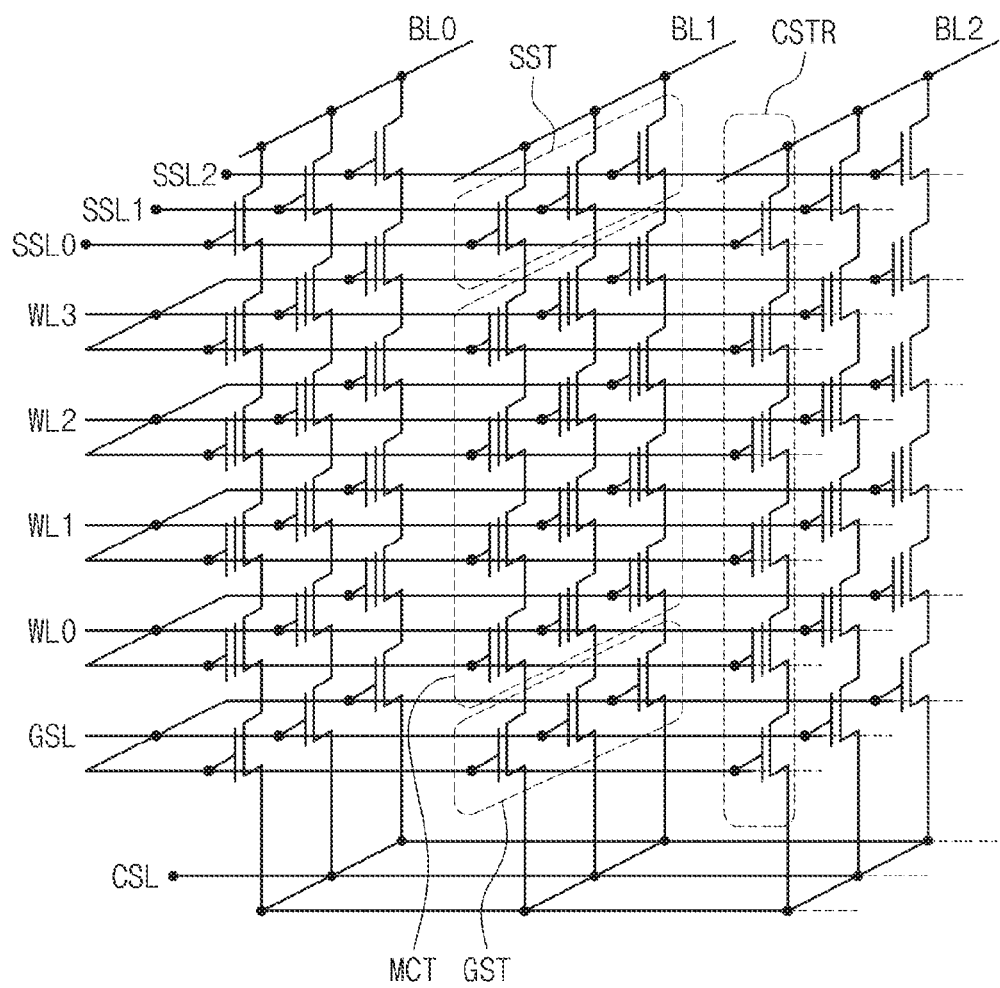
FIG. 28 is a circuit diagram of one example of a three-dimensional memory semiconductor device according to the inventive concept.

FIG. 28 illustrates an example of a circuit equivalent to that of a three-dimensional memory semiconductor device according to the inventive concept.

Referring to FIG. 28, in this example, the three-dimensional semiconductor memory device includes a common source line CSL, a plurality of bit lines BL0, BL1, and BL2, and a plurality of cell strings CSTR disposed between the common source line CSL and the bit lines BL0-BL2.

The common source line CSL may be a conductive pattern provided on the substrate 10 or a doped region provided in the substrate 100. The bit lines BL0-BL2 may be conductive patterns (for example, metal lines) provided over the substrate 100. The bit lines BL0-BL2 may be constituted by any of the bit lines 251 shown in FIGS. 9 and 18 through 21. The bit lines BL0-BL2 may be spaced apart from and parallel to each other, and a plurality of cell strings CSTR may be connected in parallel to each of the bit lines BL0-BL2. Accordingly, the cell strings CSTR may also be arrayed two-dimensionally on the common source line CSL or the substrate 100.

Each of the cell strings CSTR may include a ground selection transistor GST coupled to the common source line CSL, a string selection transistor SST coupled to one of the bit lines BL0-BL2, and a plurality of memory cell transistors MCT disposed between the ground and string selection transistors GST and SST. The ground selection transistor GST, the string selection transistor SST, and the memory cell transistors MCT may be connected in series to each other. Furthermore, a ground selection line GSL, a plurality of word lines WL0-WL3 and a plurality of string selection lines SSL0-SSL2 may be provided between the common source line CSL and the bit lines BL0-BL2 to serve as gate electrodes of the ground selection transistor GST, the memory cell transistors MCT, and the string selection transistors SST, respectively.

The ground selection transistors GST may be disposed at substantially the same level (relative to the substrate 100), and the gate electrodes thereof may be connected in common to the ground selection line GSL, thereby being in an equipotential state. Similarly, the gate electrodes of the memory cell transistors MCT located at the same level may be connected in common to one of the word lines WL0-

WL3, thereby being in an equipotential state. The word lines WL0-WL3 thus may constitute a multi-layered structure between the common source line CSL and the bit lines BL0-BL2 in the illustrated example as each of the cell strings CSTR includes a plurality of the memory cell transistors MCT disposed at different levels from each other. The word lines WL0-WL3 of the multi-layered structure may be constituted by the horizontal electrodes HE or the silicon layers 130 that were previously described with reference to FIG. 1 and FIG. 27.

Each of the cell strings CSTR may include a semiconductor pattern extending vertically from the common source line CSL and connected to one of the bit line BL0-BL3. A memory integrant, in which electric charges can be selectively stored, is interposed between the word lines WL0-WL3 and the semiconductor pattern. The memory integrant may comprise one of an insulating layer having many trap sites (e.g., a silicon nitride layer), a floating gate electrode, or an insulating layer containing conductive nano dots.

Examples of the structure of cell strings of three-dimensional memory devices having a circuit equivalent to that of FIG. 28 will now be described with reference to FIGS. 29-32. In each of these examples, the cell strings CSTR each include horizontal patterns HP which are vertically separated from each other by the interlayer insulating layers 120, and vertical patterns VP extending through the horizontal patterns HP. As mentioned above, the horizontal patterns HP may be the silicon layers 130 or the elements formed to replace the silicon layers 130 (for example, horizontal electrodes HE). In any case, the horizontal patterns HP may have the staircase-shaped structure shown in FIGS. 18 and 21.

Also, in each of the examples shown in FIGS. 29 through 32, the vertical pattern VP includes a semiconductor pattern SMP (for example, serving as a channel region of a memory cell transistors MCT) and the horizontal pattern HP includes a horizontal electrode HE (for example, serving as a gate electrodes of the memory cell transistor MCT). The vertical pattern VP may also include a vertical insulating layer VI within the semiconductor pattern SMP. Furthermore, each of the memory cell transistors MCT may also include a tunnel insulating layer TL, a charge storing layer CL, and a blocking insulating layer BK, as the memory integrant.

Figure 29:
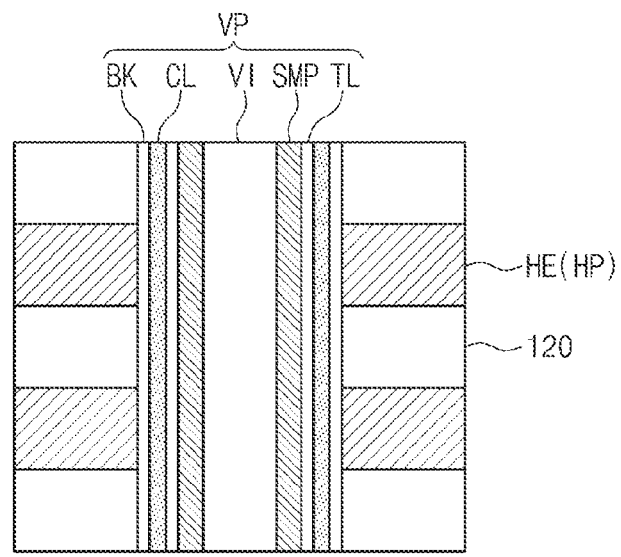
FIGS. 29, 30, 31 and 32 are sectional views of memory portions of examples of three-dimensional semiconductor memory devices according to the inventive concept, respectively.
Figure 30:
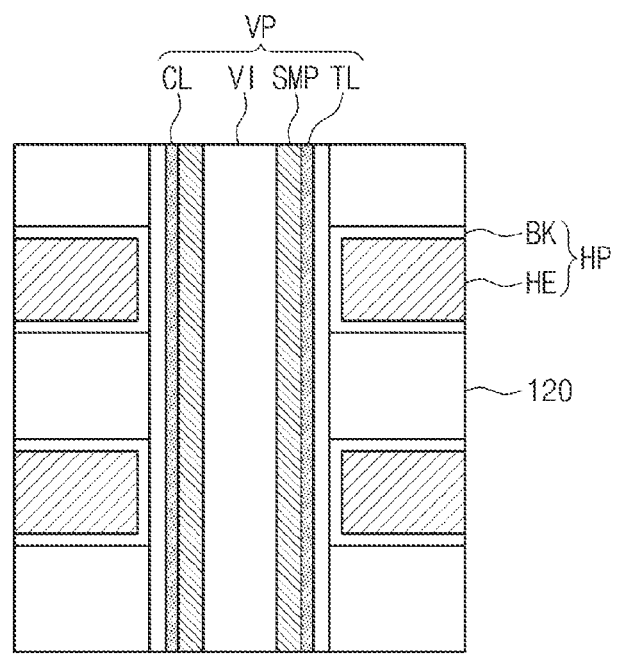
Figure 31:
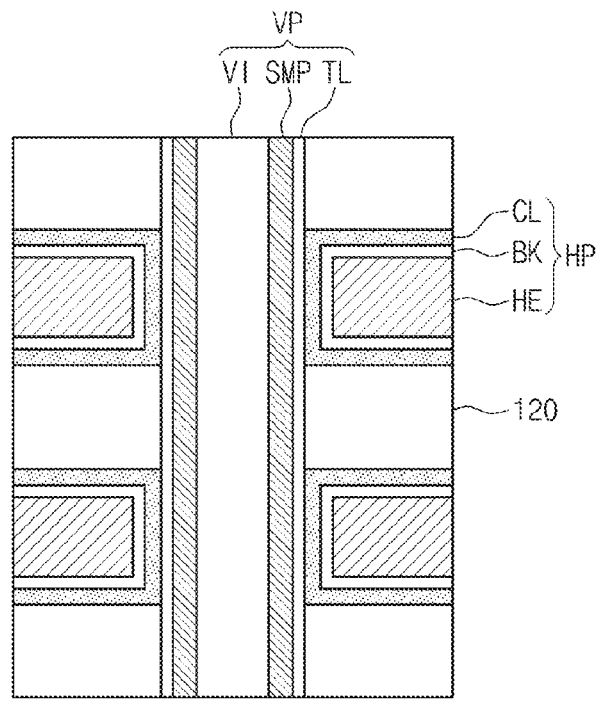
Figure 32:
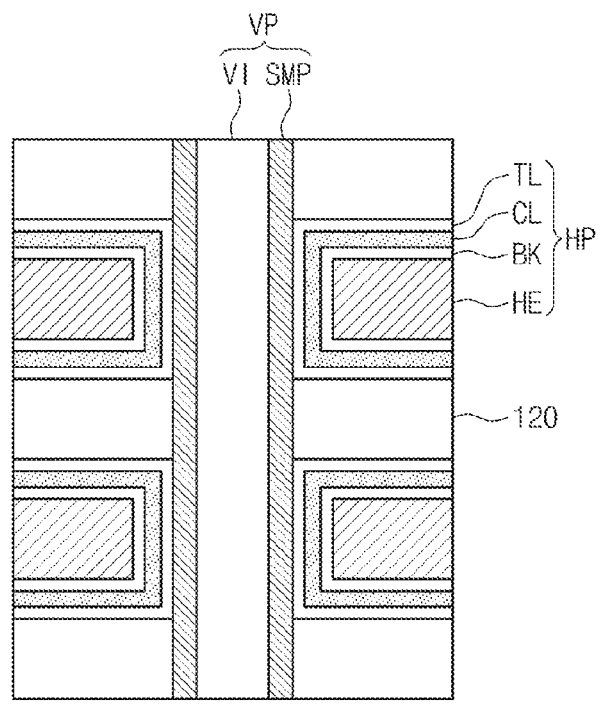

The tunnel insulating layer TL, the charge storing layer CL, and the blocking insulating layer BK may constitute the vertical pattern VP, as shown in FIG. 29. Alternatively, the tunnel insulating layer TL, the charge storing layer CL, and the blocking insulating layer BK may constitute the horizontal pattern HP, as shown in FIG. 32. In still another example, as shown in FIG. 30, the tunnel insulating layer TL and the charge storing layer CL constitute the vertical pattern VP and the blocking insulating layer BK constitutes the horizontal pattern HP. In the example shown in FIG. 31, the tunnel insulating layer TL constitutes the vertical pattern VP, and the charge storing layer CL and the blocking insulating layer BK constitute the horizontal pattern HP.

Note, the inventive concept is not limited to having cell strings configured as illustrated in FIGS. 29 through 32. For example, although FIGS. 29 through 32 show each of the tunnel insulating layer TL, the charge storing layer CL, and the blocking insulating layer BK as consisting of a single layer of material, any of these components may be constituted of multiple layers. Furthermore, in this case, at least one layer of any such memory component may constitute the vertical pattern VP, whereas at least one other layer of the same memory component may constitute the horizontal pattern HP.

The charge storing layer CL can be formed by chemical vapor deposition or atomic layer deposition. Also, the charge storing layer CL may be that part of the memory integrant mentioned above as comprising a trap insulating layer, a floating gate electrode, or an insulating layer containing conductive nano dots. More specifically, the charge storing layer CL may comprise at least one of a silicon nitride layer, a silicon oxynitride layer, a silicon-rich nitride layer, a nanocrystalline silicon layer, and a laminated trap layer.

The tunnel insulating layer TL may be of material whose band gap is greater than that of the charge storing layer CL and can be formed by chemical vapor deposition or atomic layer deposition. For example, the tunnel insulating layer TL may be a silicon oxide layer formed by chemical vapor deposition or atomic layer deposition. Furthermore, the tunnel insulating layer TL may be subjected to a thermal treatment process after the deposition process. The thermal treatment process may be a rapid thermal nitridation (RTN) process or an annealing process, which may be performed in an ambient environment of at least one of nitrogen and oxygen.

The blocking insulating layer BK may include sequentially formed first and second blocking insulating layers of different materials. One of the first and second blocking insulating layers may be of material whose band gap is smaller than that of the tunnel insulating layer TL and is greater than that of the charge storing layer CL. Furthermore, either of the first and second blocking insulating layers may be formed by chemical vapor deposition or atomic layer deposition, and at least one of them may be formed using a wet oxidation process. In one example, the first blocking insulating layer is of a high-k dielectric material (e.g., aluminum oxide or hafnium oxide), and the second blocking insulating layer is of a material whose dielectric constant is smaller than that of the first blocking insulating layer. Alternatively, the second blocking insulating layer is of a high-k dielectric, and the first blocking insulating layer is of a material whose dielectric constant is smaller than that of the second blocking insulating layer.

Figure 33:
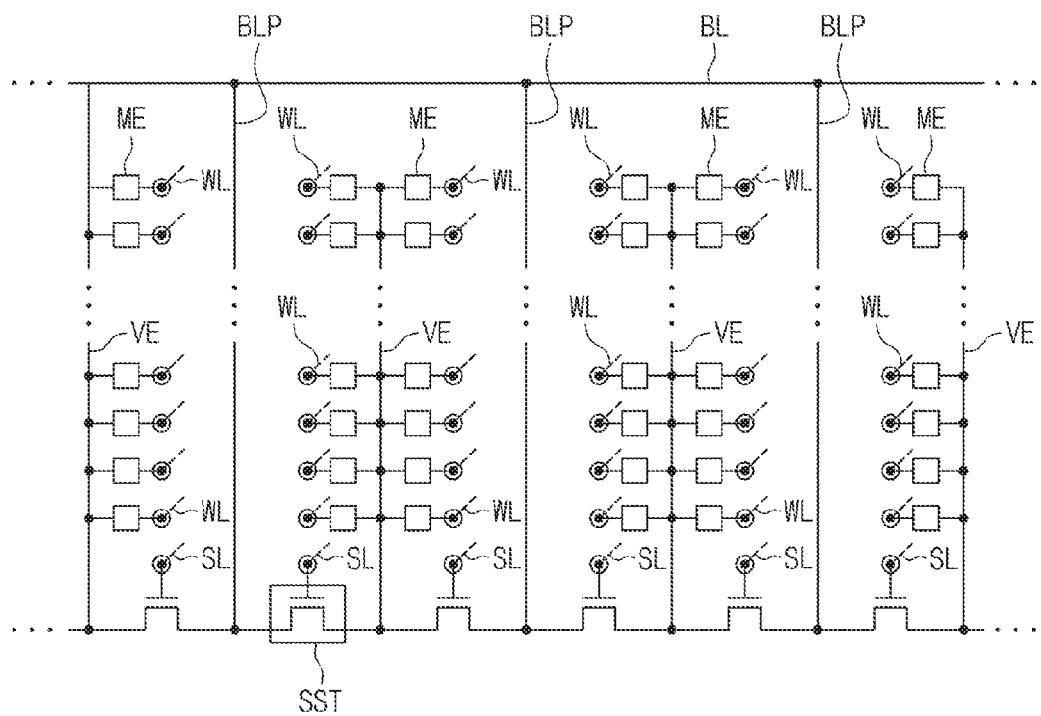
FIG. 33 is a circuit diagram of another example of a three-dimensional memory semiconductor device, according to the inventive concept.

FIG. 33 illustrates another circuit of a three-dimensional memory semiconductor device according to the inventive concept.

In the circuit of this example illustrated in FIG. 33, a plurality of selection transistors SST are connected in parallel to a bit line BL via a plurality of bit line plugs BLP. Each of the bit line plugs BLP is connected in common to a pair of the selection transistors SST disposed adjacent thereto.

Also, a plurality of word lines WL and a plurality of vertical electrodes VE are provided between the bit line BL and the selection transistors SST. The word lines WL may be silicon layers 130 or horizontal electrodes HE as previously described and configured as in any of the semiconductor device shown in described with reference to FIGS. 9 and 18 through 21. The vertical electrodes VE are provided between the bit line plugs BLP. For example, the vertical electrodes VE and the bit line plugs BLP may be alternately arranged along a direction parallel to the bit line BL. Furthermore, each of the vertical electrodes VE is connected in common to a pair of the selection transistors SST disposed adjacent thereto.

Respective memory elements ME are connected in parallel to each of the vertical electrodes VE. Each of the memory elements ME is connected to a corresponding word line WL. Therefore, each of the word lines WL may be connected to a respective one of the vertical electrodes VE via a corresponding one of the memory elements ME.

Each of the selection transistors SST may include a selection line SL serving as a gate electrode thereof. In the example of this circuit shown in FIG. 33, the selection lines SL run parallel to the word lines WL.

Three-dimensional semiconductor memory devices according to the inventive may provide circuits configured differently than those shown in FIGS. 28 and 33. These circuits are merely provided as examples.

Figure 34:
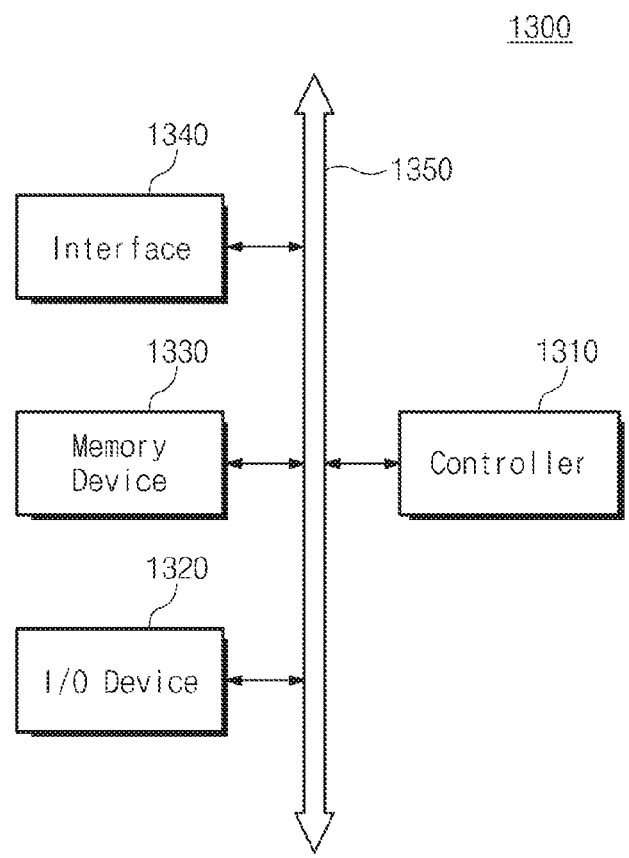
FIGS. 34 and 35 are schematic block diagrams of respective electronic devices employing a three-dimensional semiconductor device according to the inventive concept.
Figure 35:
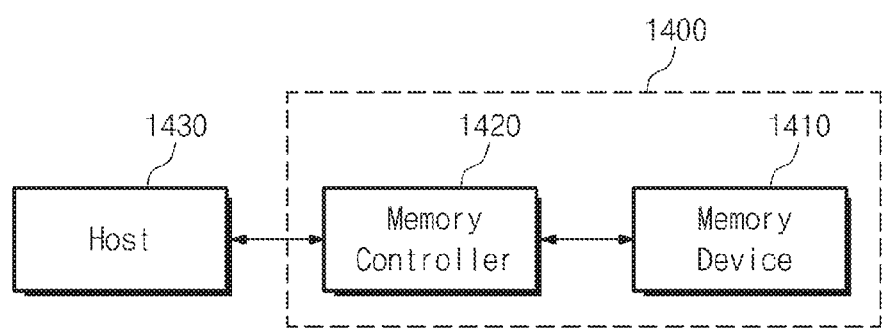

FIGS. 34 and 35 illustrate examples of electronic devices each including a three-dimensional semiconductor device, according to the inventive concept.

FIG. 34 illustrates an electronic device 1300 that may be employed by a personal digital assistant (PDA), a laptop computer, a mobile computer, a web tablet, a wireless phone, a cell phone, a digital music player, or another type of wired or wireless electronic product, or a complex electronic product including at least two of the above. The electronic device 1300 includes a controller 1310, an input/output device 1320 such as a keypad or a keyboard and a display, a memory 1330, and a wireless interface 1340 that communicate through a bus 1350. The controller 1310 may include at least one of microprocessor, a digital signal processor, and a microcontroller. The memory 1330 may be configured to store a command code to be used by the controller 1310 or to store user data. The memory 1330 includes a semiconductor device according to inventive concept. The wireless interface 1340 is configured to transmit data to or receive data from a wireless communication network using a RF signal. The wireless interface 1340 may include an antenna, a wireless transceiver or the like. The electronic system 1300 may adapted for use in a communication system employing various communication interface protocols such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, etc.

FIG. 35 illustrates a memory system 1400 including a memory device 1410 for storing large amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for use in converting an address provided from the host 1430 (e.g., a mobile device or a computer system) into a physical address of the memory device 1410. The memory device 1410 includes a semiconductor device according to inventive concepts.

A semiconductor device according to the inventive concept may also be encapsulated using various and diverse packaging techniques. For example, semiconductor devices according to the inventive concept may be encapsulated using any one of a package on package (POP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

Any of these packages including a semiconductor memory device according to the inventive concept may also include at least one other semiconductor device (e.g., a controller and/or a logic device) that controls the memory device.

According to an aspect of the inventive concept as described above, a three-dimensional semiconductor device includes a stack having a staircase-shaped section in a connection region of the device. The stack includes conductive layers providing horizontal electrodes (serving as word lines, for example), and the horizontal electrodes in the staircase-shaped section are connected to upper interconnection lines. Buffer patterns are provided on end portions, respectively, of the horizontal electrodes in the connection region, and the upper interconnection lines are electrically connected to the buffer patterns via contact plugs. The reliability of the connection between the contact plugs and the horizontal electrodes is improved by virtue of the buffer patterns. In particular, the presence of the buffer patterns makes it possible to increase the process margin in the process of forming the contact holes in which the contact plugs are formed. As a result, reliability of the three-dimensional semiconductor device is ensured.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of fabricating a three-dimensional semiconductor device, comprising:
    forming a patterned stack of alternately disposed first and second layers on a substrate,
        wherein the second layers are spaced vertically from each other and the stack has a staircase-shaped section in which respective ends of the second layers constitute treads of the staircase-shaped section, each of the second layers having an upper surface which is exposed at the end thereof constituting a respective one of the treads;
    forming discrete buffer patterns at the ends of the second layers, respectively,
        wherein the discrete buffer patterns are spaced from one another along the staircase-shaped section, each of the discrete buffer patterns is electrically conductive, and each of the discrete buffer patterns protrudes upwardly at the end of a respective one of the second layers so as to have an upper surface which is disposed at a level above the level of the upper surface of the respective second layer;
    forming contact plugs on the discrete buffer patterns; and
    forming an interconnection structure on the stack, wherein the interconnection structure includes conductive lines electrically connected to the contact plugs.

2. The method of claim 1, wherein the first layers are insulating layers and the second layers include silicon.

3. The method of claim 1, wherein the forming of the discrete buffer patterns comprises covering the ends of the second layers with lower buffer patterns, respectively.

4. The method as claimed in claim 3, wherein the lower buffer patterns are formed epitaxially.

5. The method as claimed in claim 1, wherein the forming of the discrete buffer patterns comprises forming a first upper insulating layer conformally on the stack including on the staircase-shaped section thereof, forming openings in the first upper insulating layer in alignment with the ends of the second layers, respectively, and forming upright buffer patterns in the openings, respectively.

6. The method as claimed in claim 5, wherein the upright buffer patterns are formed epitaxially.

7. The method as claimed in claim 1, wherein the forming of the discrete buffer patterns comprises forming spacer patterns on riser portions of the staircase-shaped section, respectively, and subsequently forming upright buffer patterns on the ends of the second layers while the spacer patterns are disposed on the riser portions.

8. The method as claimed in claim 7, wherein the upright buffer patterns are formed epitaxially.

9. The method as claimed in claim 1, wherein the forming of the discrete buffer patterns comprises covering the ends of the second layers with lower buffer patterns, respectively, and subsequently forming upright buffer patterns on the ends of the second layers and each of which projects above the lower buffer pattern formed on the same end of the second layer.

10. The method as claimed in claim 9, wherein the forming of the upright buffer patterns comprises forming a first upper insulating layer conformally on the stack including on the staircase-shaped section thereof and on the lower buffer patterns, forming cell buffer openings in the first upper insulating layer in alignment with the ends of the conductive layers, respectively, and forming the upright buffer patterns in the cell buffer openings, respectively.

11. The method as claimed in claim 1, wherein the forming of the discrete buffer patterns comprises covering the ends of the second layers with lower buffer patterns, respectively, forming spacer patterns on riser portions of the staircase-shaped section, respectively, after the lower buffer patterns have been formed, and subsequently forming upright buffer patterns on the lower buffer patterns, respectively, while the spacer patterns are disposed on the riser portions of the staircase-shaped section.

12. The method of claim 1, wherein the forming of the patterned stack of alternately disposed first and second layers comprises:
alternately forming the first and second layers on a substrate to produce a stack in which the second layers are spaced vertically from one another, and
patterning the stack to expose the respective ends of the second layers.

13. A method of fabricating a three-dimensional semiconductor device, comprising:
alternately forming first and second layers on a substrate to produce a stack in which the second layers are spaced vertically from one another;
patterning the stack to expose ends of each of the second layers in a connection region, wherein the patterning produces a staircase-shaped section of the stack in the connection region in which respective ends of the second layers constitute treads of the staircase-shaped section;
forming buffer patterns on and protruding above the respective ends of the second layers;
forming contact plugs on the respective buffer patterns; and
a replacement process in which all or part of each of the second layers is replaced with a conductive layer,
wherein the forming of the buffer patterns comprises forming a first upper insulating layer conformally on the stack including on the staircase-shaped section thereof, forming openings in the first upper insulating layer in alignment with the ends of the second layers, respectively, and forming upright buffer patterns in the openings, respectively.

14. The method of claim 13, wherein the replacement process is performed before the contact plugs are formed and comprises:
forming a cut through the stack,
laterally etching the second layers exposed by the cut to form interlayer gaps between the first layers and such that portions of the second layers remain between the first layers,
forming a metal layer in the interlayer gaps, and
reacting the metal layer with the portions of the second layers remaining between the first layers to form silicide patterns.

15. The method as claimed in claim 13, wherein the forming of the buffer patterns comprises covering the ends of the second layers with lower buffer patterns, respectively, before the first upper insulating layer is formed, and subsequently forming the upright buffer patterns on the lower buffer patterns, respectively.

16. The method of claim 13, further comprising forming an interconnection structure on the stack, wherein the interconnection structure includes conductive lines electrically connected to the contact plugs.

17. A method of fabricating a three-dimensional semiconductor device, comprising:
alternately forming first and second layers on a substrate to produce a stack in which the second layers are spaced vertically from one another;
patterning the stack to expose ends of each of the second layers in a connection region, wherein the patterning produces a staircase-shaped section of the stack in the connection region in which respective ends of the second layers constitute treads of the staircase-shaped section;
forming buffer patterns on and protruding above the respective ends of the second layers;
forming contact plugs on the respective buffer patterns; and
a replacement process in which all or part of each of the second layers is replaced with a conductive layer,
wherein the forming of the buffer patterns comprises covering the ends of the second layers with lower buffer patterns, respectively, subsequently forming spacer patterns on riser portions of the staircase-shaped section, respectively, and subsequently forming upright buffer patterns on the ends of the lower buffer patterns, respectively, while the spacer patterns are disposed on the riser portions.

18. The method of claim 17, wherein the replacement process is performed before the contact plugs are formed and comprises:
forming a cut through the stack,
laterally etching the second layers exposed by the cut to form interlayer gaps between the first layers and such that portions of the second layers remain between the first layers,
forming a metal layer in the interlayer gaps, and reacting the metal layer with the portions of the second layers remaining between the first layers to form silicide patterns.

19. The method of claim 17, further comprising forming an interconnection structure on the stack, wherein the interconnection structure includes conductive lines electrically connected to the contact plugs.

* * * * *